United States Patent
Pyun et al.

(10) Patent No.: US 11,368,159 B2
(45) Date of Patent: Jun. 21, 2022

(54) CLOCK DATA RECOVERY CIRCUIT, DISPLAY DEVICE, AND METHOD OF OPERATING A CLOCK DATA RECOVERY CIRCUIT

(71) Applicant: Samsung Display Co., Ltd., Yongin-Si (KR)

(72) Inventors: Ki Hyun Pyun, Gwangmyeong-si (KR); Hee Sook Park, Suwon-si (KR)

(73) Assignee: Samsung Display Co., Ltd.

(*) Notice: Subject to any disclaimer, the term of this patent is extended or adjusted under 35 U.S.C. 154(b) by 0 days.

(21) Appl. No.: 17/185,813

(22) Filed: Feb. 25, 2021

(65) Prior Publication Data
US 2021/0359688 A1    Nov. 18, 2021

(30) Foreign Application Priority Data
May 13, 2020 (KR) .................... 10-2020-0057090

(51) Int. Cl.
*H03L 7/08* (2006.01)
*G09G 5/00* (2006.01)

(52) U.S. Cl.
CPC ........... *H03L 7/0807* (2013.01); *G09G 5/008* (2013.01)

(58) Field of Classification Search
CPC .............................. H03L 7/0807; G09G 5/008
See application file for complete search history.

(56) References Cited

U.S. PATENT DOCUMENTS

| | | | | |
|---|---|---|---|---|
| 4,338,574 A * | 7/1982 | Fujita | ............... | H04L 27/2273 331/8 |
| 6,211,741 B1 * | 4/2001 | Dalmia | ............... | H03D 13/004 331/11 |
| 6,307,413 B1 * | 10/2001 | Dalmia | ............... | H04L 7/033 327/159 |
| 7,409,031 B1 * | 8/2008 | Lee | ............... | H03L 7/07 375/376 |
| 8,368,449 B1 * | 2/2013 | Bui | ............... | H03L 7/087 327/146 |

(Continued)

FOREIGN PATENT DOCUMENTS

KR    10-0547831 B1    1/2006
KR    10-0839488 B1    6/2008
(Continued)

*Primary Examiner* — Adam D Houston
(74) *Attorney, Agent, or Firm* — Innovation Counsel LLP

(57) ABSTRACT

A clock data recovery circuit includes a phase-locked loop circuit generating a multi-phase clock signal based on input data, the phase-locked loop circuit including a multi-rate phase detector being operable at an initial rate among a plurality of rates in an initial period; a lock detector generating a lock-enable signal by detecting a lock state of the phase-locked loop circuit; a dead zone calibration circuit determining an operational rate corresponding to a data rate of the input data among the plurality of rates in response to the lock-enable signal; and a digital block controlling the multi-rate phase detector to operate at the operational rate, and generating a calibration-enable signal. The dead zone calibration circuit determines whether the multi-phase clock signal is locked within a dead zone in response to the calibration-enable signal, and changes a phase of the multi-phase clock signal based on the multi-phase clock signal.

20 Claims, 12 Drawing Sheets

(56) References Cited

U.S. PATENT DOCUMENTS

| | | | | |
|---|---|---|---|---|
| 10,141,949 B1* | 11/2018 | Spaeth | ............... | G06F 13/4022 |
| 2004/0036087 A1* | 2/2004 | Okamura | .............. | H03L 7/0891 |
| | | | | 257/202 |
| 2006/0029160 A1* | 2/2006 | Kim | ..................... | H03L 7/0812 |
| | | | | 375/326 |
| 2006/0067452 A1* | 3/2006 | Xu | .......................... | H03L 7/091 |
| | | | | 375/376 |
| 2010/0172457 A1* | 7/2010 | Den Besten | .......... | H03L 7/0991 |
| | | | | 375/376 |
| 2012/0280716 A1* | 11/2012 | Mukherjee | ............ | G01R 23/10 |
| | | | | 327/12 |
| 2015/0229298 A1* | 8/2015 | Tomita | ................... | H03K 3/012 |
| | | | | 327/143 |
| 2017/0163269 A1* | 6/2017 | Chang | ..................... | H03L 7/089 |
| 2017/0237550 A1* | 8/2017 | Shin | ...................... | H03L 7/0814 |
| | | | | 375/376 |
| 2018/0083809 A1* | 3/2018 | Tajalli | ................... | H03L 7/0807 |
| 2019/0214997 A1* | 7/2019 | Meninger | ............... | H04L 7/033 |
| 2020/0099506 A1* | 3/2020 | Goudarzi | ............... | H04L 7/0025 |
| 2020/0252072 A1* | 8/2020 | Wu | ........................... | H03L 7/07 |
| 2021/0359688 A1* | 11/2021 | Pyun | .................... | H03L 7/0807 |

FOREIGN PATENT DOCUMENTS

| | | |
|---|---|---|
| KR | 10-1301698 B1 | 8/2013 |
| KR | 10-1591679 B1 | 2/2016 |

* cited by examiner

| PHASE | DCODE | | | |
| --- | --- | --- | --- | --- |
| DETECTION RATE | D1 | D2 | D3 | D4 |
| FULL RATE | 1 | 0 | 0 | 0 |
| HALF RATE | 1 | 0 | 0 | 0 |
|  | 0 | 0 | 1 | 0 |
| QUARTER RATE | 1 | 0 | 0 | 0 |
|  | 0 | 1 | 0 | 0 |
|  | 0 | 0 | 1 | 0 |
|  | 0 | 0 | 0 | 1 |

FIG. 9

| RDS1 | RDS2 | OPERATIONAL RATE |
|------|------|------------------|
| LOW  | LOW  | FULL RATE        |
| LOW  | HIGH | HALF RATE        |
| HIGH | HIGH | QUARTER RATE     |

FIG. 10

| FRATES | CAL1 | CAL3 | CAL2 | DZDS |
|--------|------|------|------|------|
| FULL RATE | LOW | LOW | LOW | LOW |
| | ANY ONE IS HIGH ||| HIGH |
| HALF RATE | LOW | LOW | × | LOW |
| | ANY ONE IS HIGH || × | HIGH |
| QUARTER RATE | × | × | × | LOW |

CLOCK DATA RECOVERY CIRCUIT, DISPLAY DEVICE, AND METHOD OF OPERATING A CLOCK DATA RECOVERY CIRCUIT

CROSS-REFERENCE TO RELATED APPLICATION(S)

This application claims priority under 35 USC § 119 to Korean Patent Application No. 10-2020-0057090, filed on May 13, 2020 in the Korean Intellectual Property Office (KIPO), the disclosure of which is incorporated by reference in its entirety.

BACKGROUND

1. Field

Exemplary embodiments of the present inventive concept relate to a display device, and more particularly to a clock data recovery circuit, a display device including the clock data recovery circuit, and a method of operating the clock data recovery circuit.

2. Description of the Related Art

A data driver of a display device may recover a clock signal and data from input data received from a controller of the display device by using a clock data recovery (CDR) circuit. The input data may be transferred from the controller to the data driver at a data rate that is selected from a plurality of data rates according to a resolution and a frame frequency of a display panel, and thus the CDR circuit may be required to support the plurality of data rates.

Such a multi-rate CDR circuit may be classified into a multi-rate CDR circuit using a multi-rate phase detector and a multi-rate CDR circuit using a multi-rate voltage-controlled oscillator. Compared with the multi-rate CDR circuit using the multi-rate voltage-controlled oscillator, the multi-rate CDR circuit using the multi-rate phase detector may have a small size and small power consumption. However, in the multi-rate CDR circuit using the multi-rate phase detector, a clock signal may be locked within a dead zone.

SUMMARY

Some exemplary embodiments provide a clock data recovery (CDR) circuit capable of preventing a clock signal from being locked within a dead zone.

Some exemplary embodiments provide a display device including a CDR circuit that is capable of preventing a clock signal from being locked within a dead zone.

Some exemplary embodiments provide a method of operating a CDR circuit that is capable of preventing a clock signal from being locked within a dead zone.

According to an exemplary embodiment, a clock data recovery (CDR) circuit includes a phase-locked loop circuit configured to generate a multi-phase clock signal based on input data, the phase-locked loop circuit including a multi-rate phase detector being operable at a plurality of rates, the multi-rate phase detector configured to operate at an initial rate that is a predetermined one of the plurality of rates in an initial period; a lock detector configured to generate a lock-enable signal by detecting a lock state of the phase-locked loop circuit; a dead zone calibration circuit configured to determine an operational rate corresponding to a data rate of the input data among the plurality of rates in response to the lock-enable signal; and a digital block configured to control the multi-rate phase detector to operate at the operational rate and generate a calibration-enable signal. The dead zone calibration circuit determines whether the multi-phase clock signal is locked within a dead zone in response to the calibration-enable signal, and changes a phase of the multi-phase clock signal based on the multi-phase clock signal being locked within the dead zone.

In exemplary embodiments, the plurality of rates may include a full rate where the multi-rate phase detector performs a phase detection operation per a full period of the multi-phase clock signal, a half rate where the multi-rate phase detector performs the phase detection operation per a half period of the multi-phase clock signal, and a quarter rate where the multi-rate phase detector performs the phase detection operation per a quarter period of the multi-phase clock signal, and the initial rate may be the full rate.

In exemplary embodiments, the data rate of the input data may be one of a first data rate, a second data rate that is double of the first data rate, and a third data rate that is double of the second data rate, and the dead zone calibration circuit may determine, in response to the lock-enable signal, that: the operational rate is the full rate based on the data rate of the input data being the first data rate, the operational rate is the half rate based on the data rate of the input data being the second data rate, and the operational rate is the quarter rate based on the data rate of the input data being the third data rate.

In exemplary embodiments, a phase range of the multi-phase clock signal corresponding to one period of the multi-phase clock signal may be divided into a first phase range, a second phase range, a third phase range, and a fourth phase range, and the multi-phase clock signal may be locked within the first phase range by the multi-rate phase detector operating at the initial rate. The dead zone calibration circuit may detect a first edge of the input data within the second phase range and a second edge of the input data within the third phase range, may further determine, in response to the lock-enable signal, that: the operational rate is the full rate based on the first edge and the second edge being undetected, the operational rate is the half rate based on the first edge being undetected and the second edge being detected, and the operational rate is the quarter rate based on the first edge and the second edge being detected.

In exemplary embodiments, the dead zone calibration circuit may further detect a third edge of the input data within the fourth phase range. In a first case where the operational rate is determined as the full rate, the dead zone calibration circuit may determine that the multi-phase clock signal is locked within the dead zone based on the first edge, the second edge, or the third edge being detected in response to the calibration-enable signal. In a second case where the operational rate is determined as the half rate, the dead zone calibration circuit may determine that the multi-phase clock signal is locked within the dead zone based on the first edge or the third edge being detected in response to the calibration-enable signal. In a third case where the operational rate is determined as the quarter rate, the dead zone calibration circuit may determine that the multi-phase clock signal unlocked within the dead zone in response to the calibration-enable signal.

In exemplary embodiments, the dead zone calibration circuit may provide an additional charge pump current to a loop filter included in the phase-locked loop circuit to change the phase of the multi-phase clock signal based on the multi-phase clock signal being locked within the dead zone.

In exemplary embodiments, a phase range of the multi-phase clock signal corresponding to one period of the multi-phase clock signal may be divided into a first phase range, a second phase range, a third phase range and a fourth phase range. The dead zone calibration circuit may include: an edge detection block configured to detect a first edge of the input data within the second phase range, a second edge of the input data within the third phase range, and a third edge of the input data within the fourth phase range; a rate determination block configured to determine the operational rate based on the lock-enable signal, the first edge, and the second edge; a dead zone detection block configured to determine whether the multi-phase clock signal is locked within the dead zone based on the calibration-enable signal, the operational rate, the first edge, the second edge and the third edge; and a dead zone charge pump configured to provide an additional charge pump current to a loop filter included in the phase-locked loop circuit based on the multi-phase clock signal being locked within the dead zone.

In exemplary embodiments, the multi-phase clock signal may include a first clock signal, a second clock signal, a third clock signal, a fourth clock signal, a fifth clock signal, a sixth clock signal, a seventh clock signal, and an eighth clock signal having different phases. The edge detection block may include a first flip-flop configured to sample the input data in response to the third clock signal, a second flip-flop configured to sample the input data in response to the fifth clock signal, a third flip-flop configured to sample the input data in response to the seventh clock signal, a fourth flip-flop configured to sample the input data in response to the first clock signal, a first XOR gate configured to detect the first edge by performing a first XOR operation on a first output signal of the first flip-flop and a second output signal of the second flip-flop, a second XOR gate configured to detect the second edge by performing a second XOR operation on the second output signal of the second flip-flop and a third output signal of the third flip-flop, and a third XOR gate configured to detect the third edge by performing a third XOR operation on the third output signal of the third flip-flop and a fourth output signal of the fourth flip-flop.

In exemplary embodiments, the edge detection block may further include a fifth flip-flop located between the first flip-flop and the first XOR gate, and configured to sample the first output signal of the first flip-flop in response to the fourth clock signal, a sixth flip-flop located between the second flip-flop and the first XOR gate, and configured to sample the second output signal of the second flip-flop in response to the sixth clock signal, a seventh flip-flop located between the second flip-flop and the second XOR gate, and configured to sample the second output signal of the second flip-flop in response to the sixth clock signal, an eighth flip-flop located between the third flip-flop and the second XOR gate, and configured to sample the third output signal of the third flip-flop in response to the sixth clock signal, a ninth flip-flop located between the third flip-flop and the third XOR gate, and configured to sample the third output signal of the third flip-flop in response to the eighth clock signal, and a tenth flip-flop located between the fourth flip-flop and the third XOR gate, and configured to sample the fourth output signal of the fourth flip-flop in response to the eighth clock signal.

In exemplary embodiments, the rate determination block may include a first multiplexer configured to selectively output a first XOR output signal of the first XOR gate or a low power supply voltage in response to the lock-enable signal as a fifth output signal, a second multiplexer configured to selectively output a second XOR output signal of the second XOR gate or the low power supply voltage in response to the lock-enable signal as a sixth output signal, an eleventh flip-flop configured to generate a first rate detection signal by sampling a high power supply voltage in response to the fifth output signal of the first multiplexer, and a twelfth flip-flop configured to generate a second rate detection signal by sampling the high power supply voltage in response to the sixth output signal of the second multiplexer.

In exemplary embodiments, the digital block may control the multi-rate phase detector to operate: at a full rate as the operational rate based on both of the first rate detection signal and the second rate detection signal having a low level, at a half rate as the operational rate based on the first rate detection signal having the low level and the second rate detection signal having a high level, and at a quarter rate as the operational rate based on both of the first rate detection signal and the second rate detection signal having the high level.

In exemplary embodiments, the dead zone detection block may include a third multiplexer configured to selectively output a first XOR output signal of the first XOR gate or a low power supply voltage as a first calibration signal in response to the calibration-enable signal, a fourth multiplexer configured to selectively output a second XOR output signal of the second XOR gate or the low power supply voltage as a second calibration signal in response to the calibration-enable signal, a fifth multiplexer configured to selectively output a third XOR output signal of the third XOR gate or the low power supply voltage as a third calibration signal in response to the calibration-enable signal, a first OR gate configured to output a full rate calibration signal by performing a first OR operation on the first calibration signal, the second calibration signal and the third calibration signal, a second OR gate configured to output a half rate calibration signal by performing a second OR operation on the first calibration signal and the third calibration signal, and a sixth multiplexer configured to selectively output the full rate calibration signal, the half rate calibration signal, or the low power supply voltage as a dead zone detection signal in response to an operational rate signal corresponding to the operational rate.

In exemplary embodiments, the dead zone charge pump may not provide the additional charge pump current to the loop filter based on the dead zone detection signal having a low level, and may provide the additional charge pump current to the loop filter based on the dead zone detection signal having a high level.

In exemplary embodiments, the additional charge pump current may be a negative current, and the phase-locked loop circuit may increase the phase of the multi-phase clock signal based on the additional charge pump current provided by the dead zone charge pump.

In exemplary embodiments, the phase-locked loop circuit may include the multi-rate phase detector configured to detect a phase difference between the input data and the multi-phase clock signal, a charge pump configured to generate a charge pump current in response to the phase difference detected by the multi-rate phase detector, a loop filter configured to generate a control voltage by filtering the charge pump current, and a voltage-controlled oscillator configured to generate the multi-phase clock signal based on the control voltage.

In exemplary embodiments, the multi-phase clock signal may include a first clock signal, a second clock signal, a third clock signal, a fourth clock signal, a fifth clock signal, a sixth clock signal, a seventh clock signal, and an eighth clock signal having different phases. The multi-rate phase detector may include a first flip-flop, a second flip-flop, a third flip-flop, a fourth flip-flop, a fifth flip-flop, a sixth flip-flop, a seventh flip-flop, and an eighth flip-flop configured to sample the input data in response to the first clock signal, the second clock signal, the third clock signal, the fourth clock signal, the fifth clock signal, the sixth clock signal, the seventh clock signal, and the eighth clock signal, respectively, a first XOR gate including a first input terminal, a second input terminal, and a first output terminal at which an up-signal is output, a second XOR gate including a third input terminal, a fourth input terminal, and a second output terminal at which a down-signal is output, a first switching block configured to selectively provide a first output signal of the first flip-flop, a third output signal of the third flip-flop, a fifth output signal of the fifth flip-flop, or a seventh output signal of the seventh flip-flop to the first input terminal in response to a digital code received from the digital block, a second switching block configured to selectively provide a second output signal of the second flip-flop, a fourth output signal of the fourth flip-flop, a sixth output signal of the sixth flip-flop, or an eighth output signal of the eighth flip-flop to the second input terminal and the third input terminal in response to the digital code, and a third switching block configured to selectively provide the third output signal of the third flip-flop, the fifth output signal of the fifth flip-flop, the seventh output signal of the seventh flip-flop, or the first output signal of the first flip-flop to the fourth input terminal in response to the digital code.

In exemplary embodiments, in a first case where the operational rate is determined as a full rate, the multi-rate phase detector may output the sixth output signal of the sixth flip-flop as recovered data. In a second case where the operational rate is determined as a half rate, the multi-rate phase detector may output the fourth output signal of the fourth flip-flop and the eighth output signal of the eighth flip-flop as the recovered data. In a third case where the operational rate is determined as a quarter rate, the multi-rate phase detector may output the first output signal of the first flip-flop, the third output signal of the third flip-flop, the fifth output signal of the fifth flip-flop, and the seventh output signal of the seventh flip-flop as the recovered data.

According to an exemplary embodiment, a display device includes a display panel including a plurality of pixels; a data driver including a clock data recovery (CDR) circuit configured to generate a multi-phase clock signal and recovered data based on input data, and configured to provide data signals corresponding to the recovered data to the plurality of pixels; and a controller configured to provide the input data to the data driver. The CDR circuit includes a phase-locked loop circuit configured to generate the multi-phase clock signal based on the input data, the phase-locked loop circuit including a multi-rate phase detector being operable at a plurality of rates, the multi-rate phase detector configured to operate at an initial rate that is a predetermined one of the plurality of rates in an initial period; a lock detector configured to generate a lock-enable signal by detecting a lock state of the phase-locked loop circuit; a dead zone calibration circuit configured to determine an operational rate corresponding to a data rate of the input data among the plurality of rates in response to the lock-enable signal; and a digital block configured to control the multi-rate phase detector to operate at the operational rate and generate a calibration-enable signal. The dead zone calibration circuit determines whether the multi-phase clock signal is locked within a dead zone in response to the calibration-enable signal, and changes a phase of the multi-phase clock signal based on the multi-phase clock signal being locked within the dead zone.

According to an exemplary embodiment, a method includes: generating a multi-phase clock signal based on input data by operating a multi-rate phase detector that is operable at a plurality of rates at an initial rate that is a predetermined one of the plurality of rates in an initial period; detecting a lock state of a phase-locked loop circuit including the multi-rate phase detector; determining an operational rate corresponding to a data rate of the input data among the plurality of rates; controlling the multi-rate phase detector to operate at the operational rate; determining whether the multi-phase clock signal is locked within a dead zone; and changing a phase of the multi-phase clock signal based on the multi-phase clock signal being locked within the dead zone.

In exemplary embodiments, the plurality of rates may include a full rate, a half rate, and a quarter rate, and the initial rate may be the full rate.

As described above, in a CDR circuit, a display device and a method of operating the CDR circuit according to an exemplary embodiment, a multi-rate phase detector may operate at a full rate in an initial period, a dead zone calibration circuit may determine an operational rate corresponding to a data rate in response to a lock-enable signal, the multi-rate phase detector may operate at the operational rate after the initial period, and the dead zone calibration circuit may perform a dead zone calibration operation that changes a phase of a multi-phase clock signal when the multi-phase clock signal is locked within a dead zone in response to a calibration-enable signal. Accordingly, the multi-phase clock signal may be prevented from being locked within the dead zone, an error of recovered data may be prevented, and a size and power consumption of the CDR circuit may be reduced.

BRIEF DESCRIPTION OF THE DRAWINGS

Illustrative, non-limiting exemplary embodiments will be more clearly understood from the following detailed description in conjunction with the accompanying drawings.

FIG. 9 shows an example of an operational rate according to a first rate detection signal and a second rate detection signal.

FIG. 10 shows an example of a dead zone detection signal according to an operational rate signal, a first calibration signal, a second calibration signal, and a third calibration signal.

DETAILED DESCRIPTION OF THE EMBODIMENTS

Hereinafter, exemplary embodiments of the present inventive concept will be explained in detail with reference to the accompanying drawings.

Figure 1:
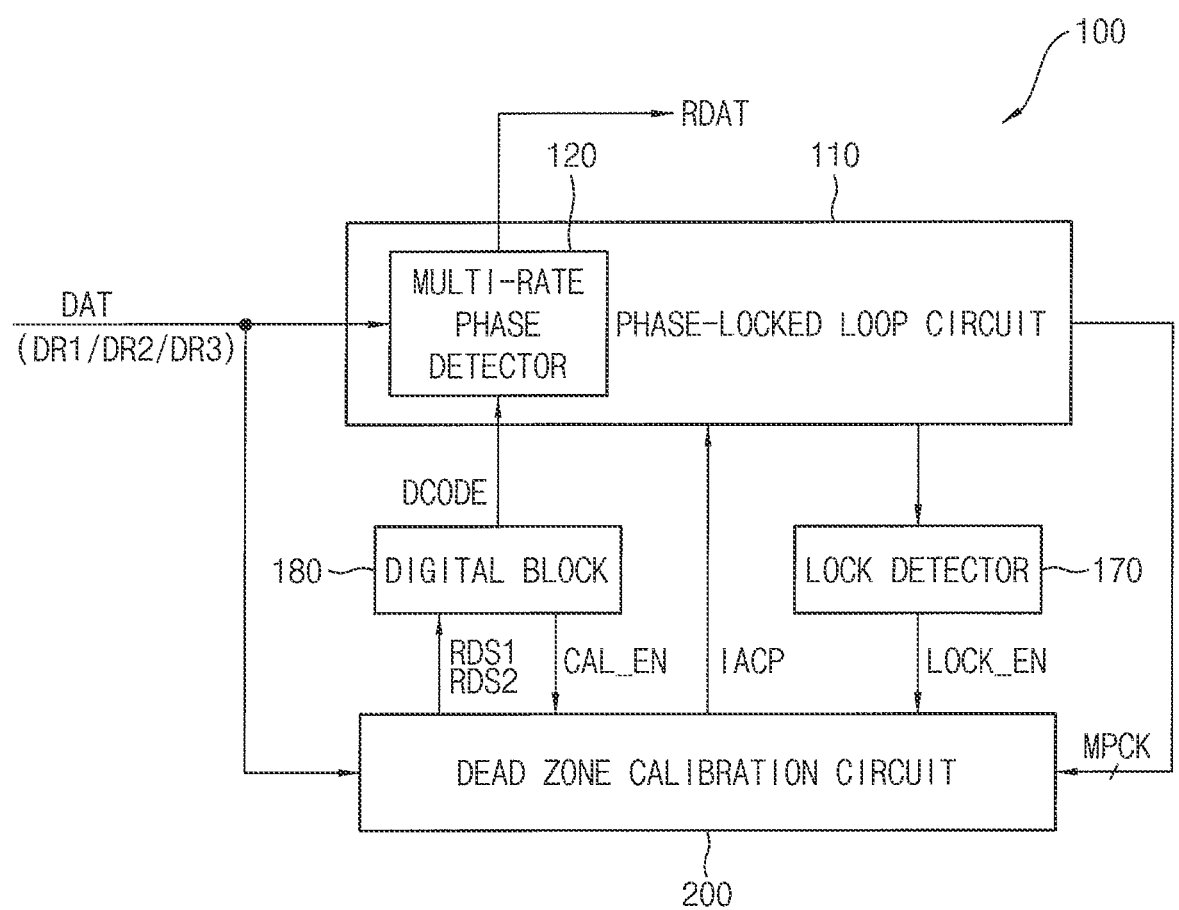
FIG. 1 is a block diagram of a clock data recovery (CDR) circuit according to an exemplary embodiment.
Figure 2:
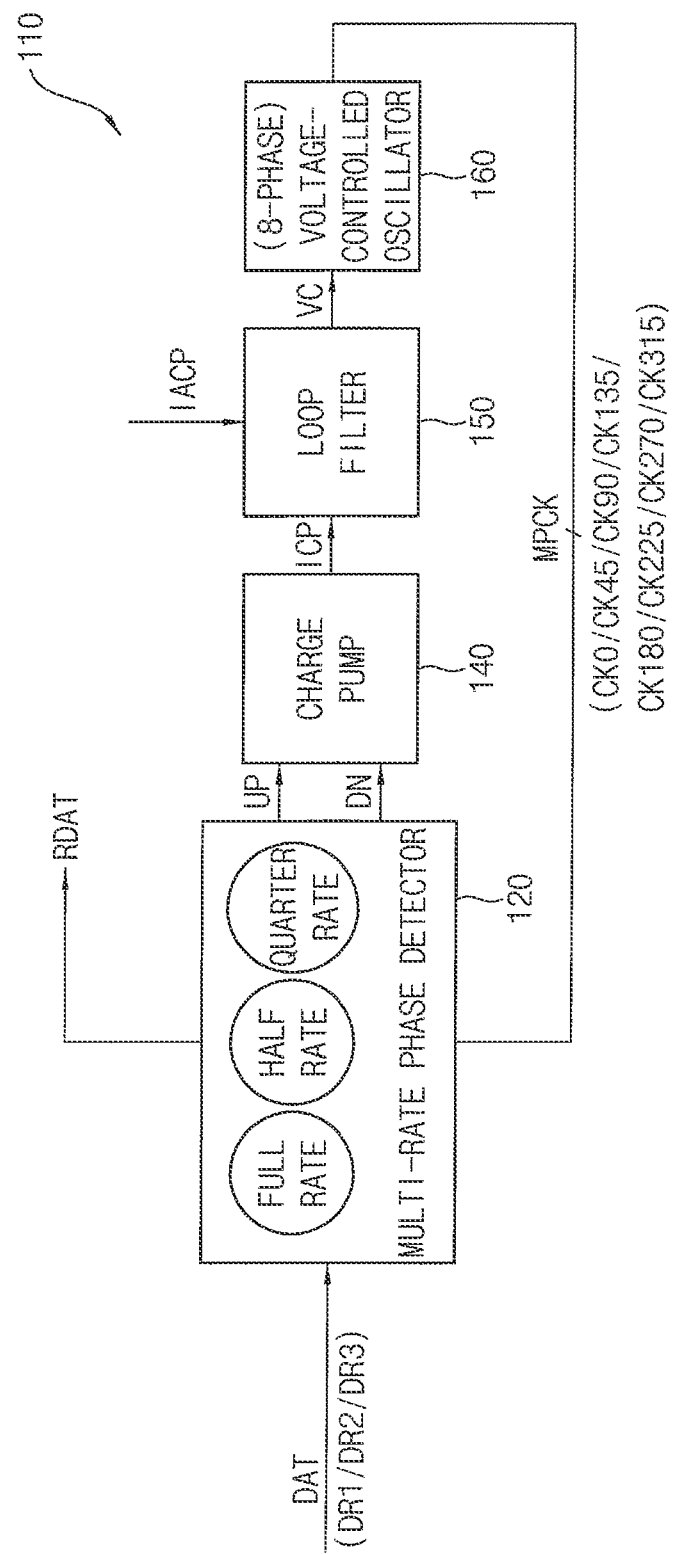
FIG. 2 is a block diagram of a phase-locked loop circuit included in a CDR circuit according to an exemplary embodiment.
Figure 3:
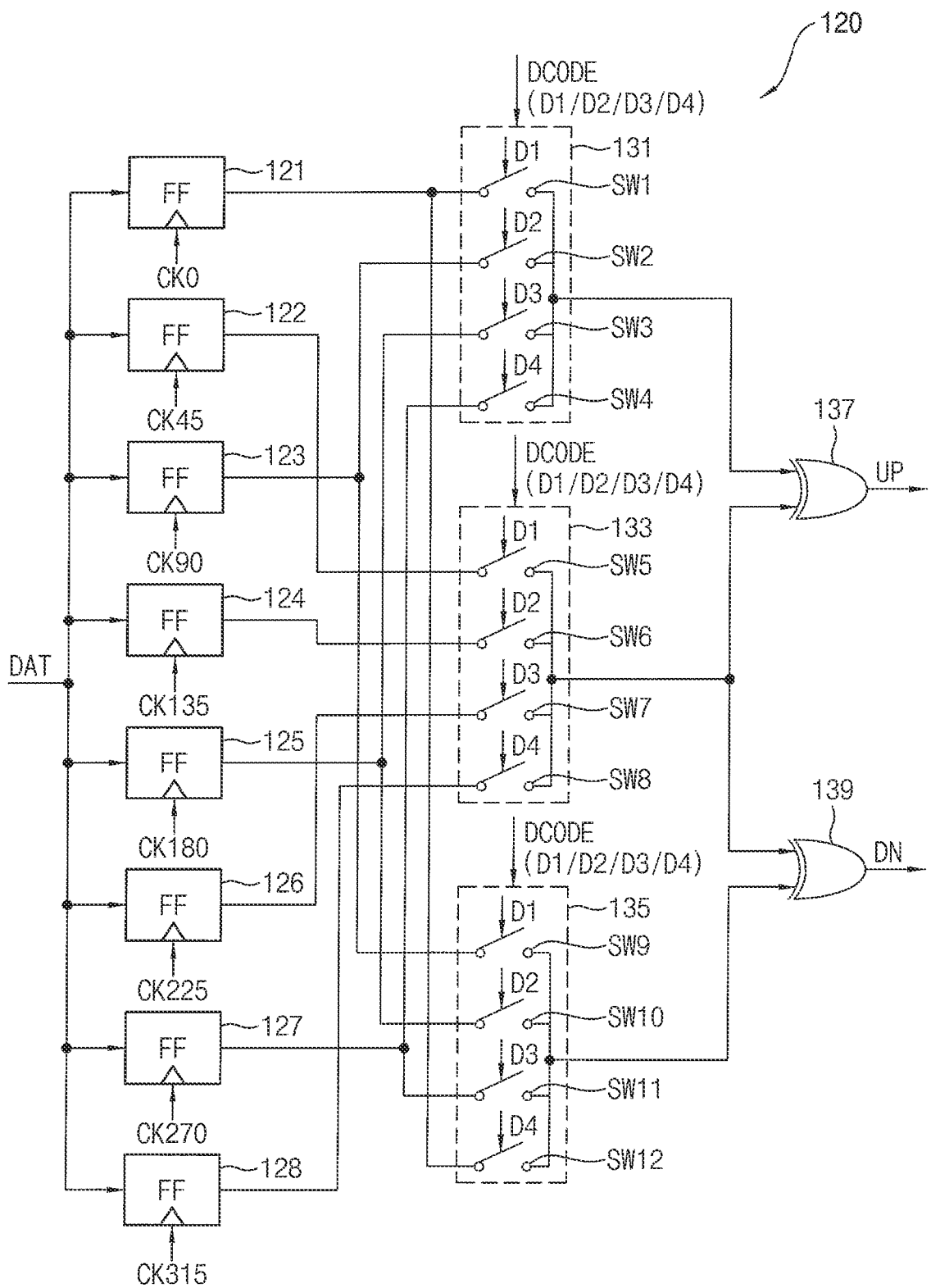
FIG. 3 is a block diagram of a multi-rate phase detector included in the phase-locked loop circuit of FIG. 2.
Figures 4, 5:
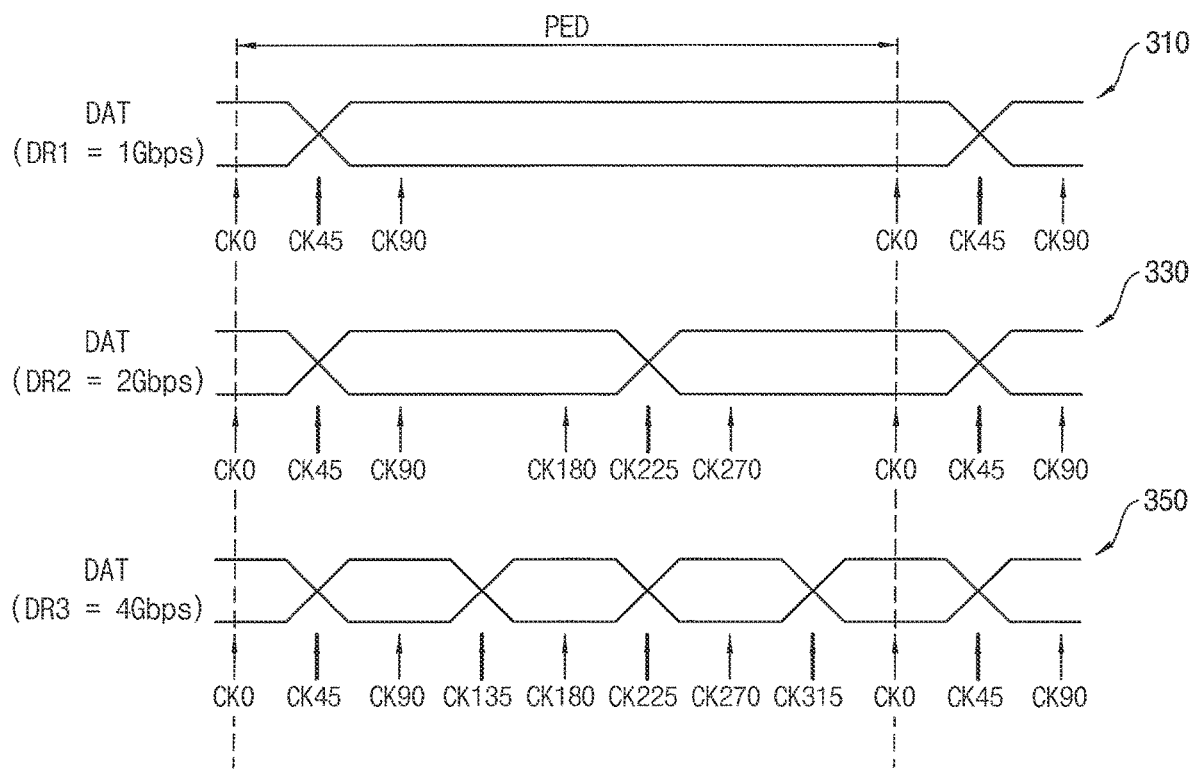
FIG. 4 shows examples of digital codes according to phase detection rates.
FIG. 5 is an example timing diagram of phase detection operations of a multi-rate phase detector operating at a full rate, a half rate, and a quarter rate.
Figure 6:
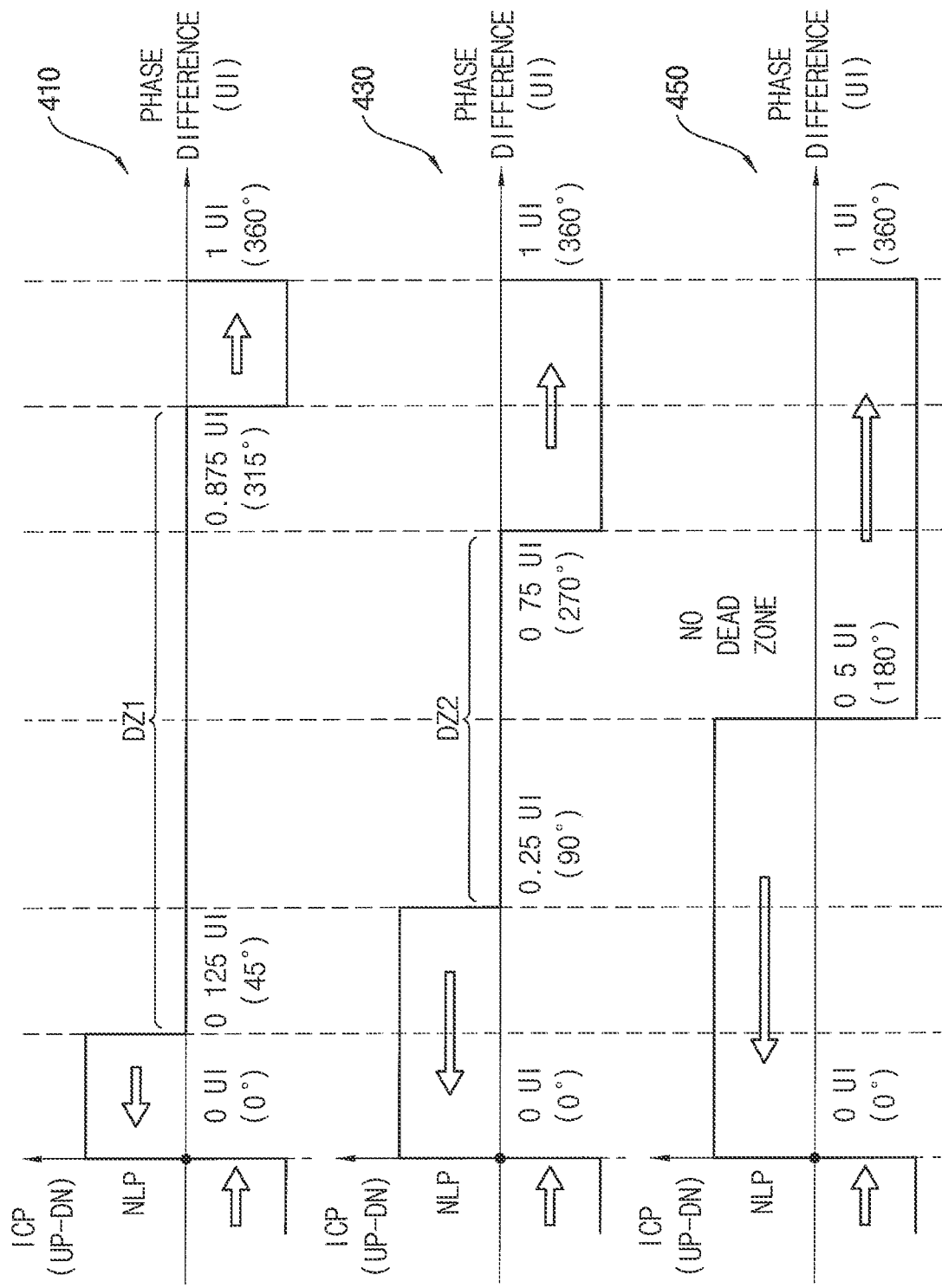
FIG. 6 shows examples of lock points and dead zones of multi-phase clock signals at a CDR circuit that does not include a dead zone calibration circuit.
Figure 7:
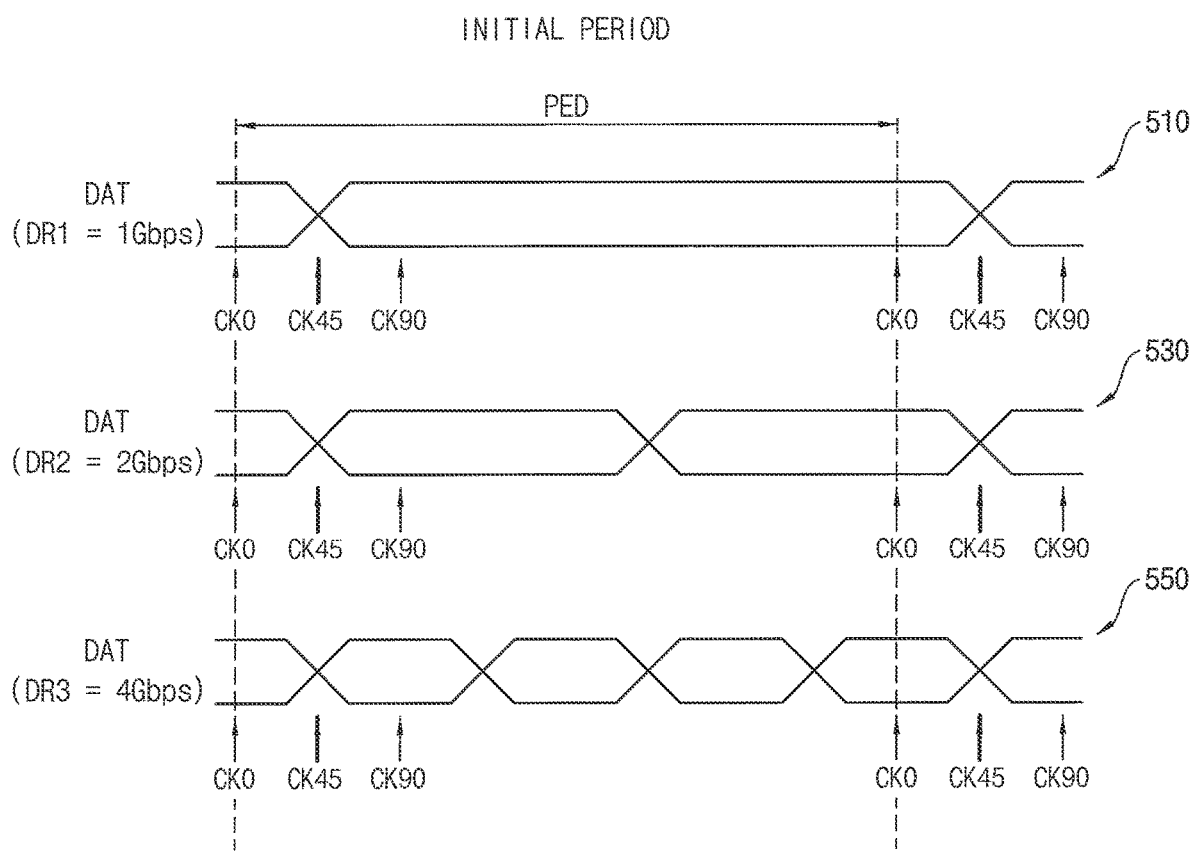
FIG. 7 is a timing diagram of a multi-rate phase detector included in a CDR circuit in an initial period according to an exemplary embodiment.
Figure 8:
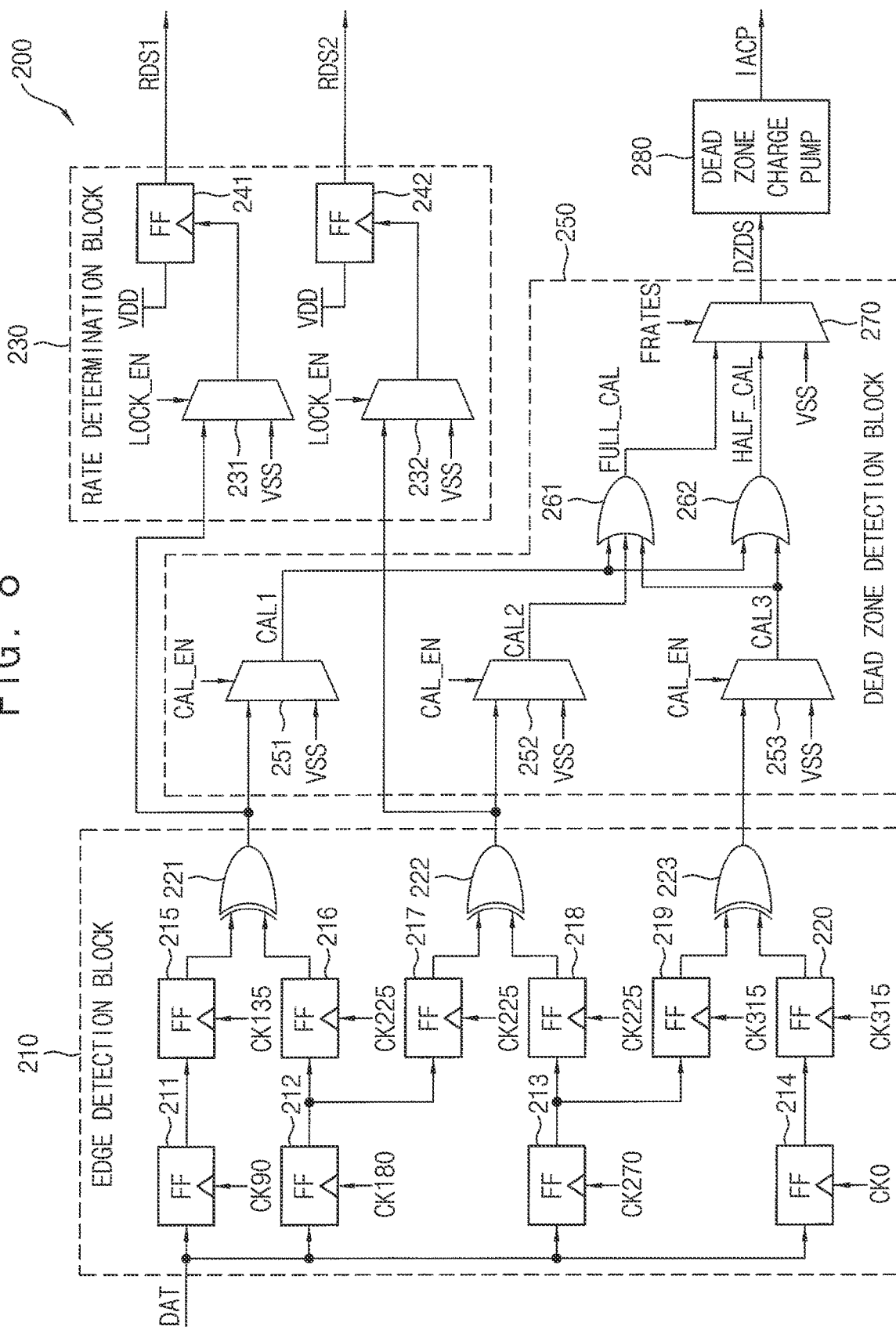
FIG. 8 is a block diagram of a dead zone calibration circuit included in a CDR circuit according to an exemplary embodiment.
Figure 11:
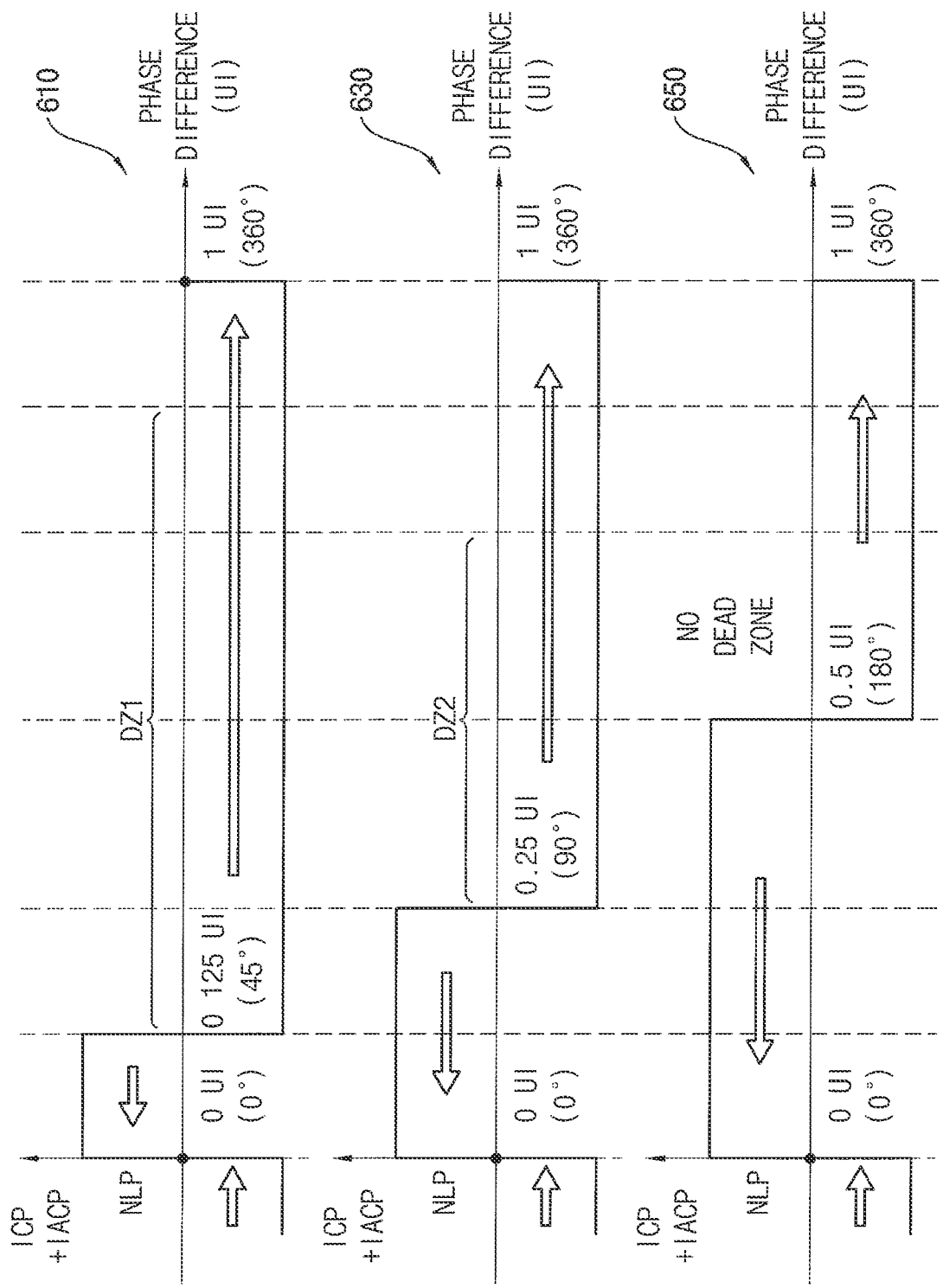
FIG. 11 shows examples of lock points and dead zones of multi-phase clock signals at a CDR circuit according to an exemplary embodiment.

FIG. 1 is a block diagram of a clock data recovery (CDR) circuit according to an exemplary embodiment, FIG. 2 is a block diagram of a phase-locked loop circuit included in a CDR circuit according to an exemplary embodiment, FIG. 3 is a block diagram of a multi-rate phase detector included in the phase-locked loop circuit of FIG. 2, FIG. 4 shows examples of digital codes according to phase detection rates, FIG. 5 is an example timing diagram of phase detection operations of a multi-rate phase detector operating at a full rate, a half rate, and a quarter rate, FIG. 6 shows examples of lock points and dead zones of multi-phase clock signals at a CDR circuit that not includes a dead zone calibration circuit, FIG. 7 is a timing diagram of a multi-rate phase detector included in a CDR circuit in an initial period according to an exemplary embodiment, FIG. 8 is a block diagram of a dead zone calibration circuit included in a CDR circuit according to an exemplary embodiment, FIG. 9 shows an example of an operational rate according to a first rate detection signal and a second rate detection signal, FIG. 10 shows an example of a dead zone detection signal according to an operational rate signal, a first calibration signal, a second calibration signal, and a third calibration signal, and FIG. 11 shows examples of lock points and dead zones of multi-phase clock signals at a CDR circuit according to an exemplary embodiment.

Referring to FIG. 1, a CDR circuit 100 included in a data driver of a display device may include a phase-locked loop circuit 110 that generates a multi-phase clock signal MPCK based on input data DAT, a lock detector 170 that detects a lock state of the phase-locked loop circuit 110, a digital block 180 that provides a digital code DCODE to a multi-rate phase detector 120 included in the phase-locked loop circuit 110, and a dead zone calibration circuit 200 that performs a dead zone calibration operation on the multi-phase clock signal MPCK.

The phase-locked loop circuit 110 may receive the input data DAT from a controller (e.g., a timing controller (TCON)) of the display device, may generate the multi-phase clock signal MPCK based on the input data DAT, and may generate recovered data RDAT by sampling the input data DAT in response to the multi-phase clock signal MPCK. The multi-phase clock signal MPCK may include a plurality of clock signals having different phases. For example, the multi-phase clock signal MPCK may include first through eighth clock signals respectively having eighth edges at eight time points into which one period is equally divided, or respectively having eight phases into which a phase of 360 degrees corresponding to one period is equally divided.

In some exemplary embodiments, the phase-locked loop circuit 110 may receive the input data DAT at one of various data rates DR1, DR2, and DR3 according to a resolution and/or a frame frequency of a display panel driven by the data driver. For example, the phase-locked loop circuit 110 may receive the input data DAT at a first data rate DR1 of about 1 Gigabit per second (Gbps) in a case where the display panel has a 4K ultra high-definition (UHD) resolution and is driven at a frame frequency of about 60 Hz, may receive the input data DAT at a second data rate DR2 of about 2 Gbps that is double of the first data rate DR1 in a case where the display panel has the 4K UHD resolution and is driven at a frame frequency of about 120 Hz, and may receive the input data DAT at a third data rate DR3 of about 4 Gbps that is double of the second data rate DR2 in a case where the display panel has an 8K UHD resolution and is driven at a frame frequency of about 120 Hz. To support the various data rates DR1, DR2, and DR3 of the input data DAT, the phase-locked loop circuit 110 may include the multi-rate phase detector 120 that is operable at a plurality of rates.

Referring to FIGS. 1 and 2, the phase-locked loop circuit 110 may include the multi-rate phase detector 120, a charge pump 140, a loop filter 150, and a voltage-controlled oscillator 160. The multi-rate phase detector 120 may detect a phase difference between the input data DAT and the multi-phase clock signal MPCK, and may generate a signal (e.g., an up-signal UP and/or a down-signal DN) corresponding to the phase difference. For example, the multi-rate phase detector 120 may generate the up-signal UP in a case where the input data DAT lead the multi-phase clock signal MPCK, and may generate the down-signal DN in a case where the multi-phase clock signal MPCK leads the input data DAT. The charge pump 140 may generate a charge pump current ICP in response to the phase difference detected by the multi-rate phase detector 120. For example, the charge pump 140 may provide a positive charge pump current ICP to the loop filter 150 in response to the up-signal UP. Further, in response to the down-signal DN, the charge pump 140 may provide a negative charge pump current ICP to the loop filter 150, or may draw the charge pump current ICP from the loop filter 150. The loop filter 150 may generate a control voltage VC by filtering the charge pump current ICP. For example, the loop filter 150 may increase the control voltage VC in response to the positive charge pump current ICP, and may decrease the control voltage VC in response to the negative charge pump current ICP. Further, in some exemplary embodiments, the loop filter 150 may remove or reduce a high-frequency noise component of the multi-phase clock signal MPCK. The voltage-controlled oscillator 160 may generate the multi-phase clock signal MPCK based on the control voltage VC received from the loop filter 150. For example, the voltage-controlled oscillator 160 may decrease a phase of the multi-phase clock signal MPCK as the control voltage VC increases, and may increase the phase of the multi-phase clock signal MPCK as the control voltage VC decreases. In some exemplary embodiments, the voltage-controlled oscillator 160 may be an eight-phase voltage-controlled oscillator that generates, as the multi-phase clock signal MPCK having different phases, for example, first through eighth clock signals CK0, CK45, CK90, CK135, CK180, CK225, CK270, and CK315. The first clock signal CK0 may have a phase of about 0 degree, the second clock signal CK45 may have a phase of about 45 degrees, the third clock signal CK90 may have a phase of about 90 degrees, the fourth clock signal CK135 may have a phase of about 135 degrees, the fifth clock signal CK180 may have a phase of about 180 degrees, the sixth clock signal CK225 may have a phase of about 225 degrees, the seventh clock signal CK270 may have a phase of about 270 degrees, and the eighth clock signal CK315 may have a phase of about 315 degrees.

The multi-rate phase detector 120 may operate at one of the plurality of rates. In some exemplary embodiments, the multi-rate phase detector 120 may operate at a full rate FULL RATE corresponding to the first data rate DR1 of the input data DAT, at a half rate HALF RATE corresponding to the second data rate DR2 that is double of the first data rate DR1, or at a quarter rate QUARTER RATE corresponding to the third data rate DR3 that is double of the second data rate DR2. In some exemplary embodiments, to operate at the full rate FULL RATE, the half rate HALF RATE, or the quarter rate QUARTER RATE. Referring to FIG. 3, the multi-rate phase detector 120 may include first through eighth flip-flops 121 through 128, first through third switching blocks 131, 133, and 135, and first and second XOR gates 137 and 139.

The first through eighth flip-flops 121 through 128 may sample the input data DAT in response to the first through eighth clock signals CK0, CK45, CK90, CK135, CK180, CK225, CK270 and CK315, respectively. For example, the first flip-flop 121 may sample the input data DAT in response to the first clock signal CK0 having the phase of about 0 degree, the second flip-flop 122 may sample the input data DAT in response to the second clock signal CK45 having the phase of about 45 degrees, the third flip-flop 123 may sample the input data DAT in response to the third clock signal CK90 having the phase of about 90 degrees, the fourth flip-flop 124 may sample the input data DAT in response to the fourth clock signal CK135 having the phase of about 135 degrees, the fifth flip-flop 125 may sample the input data DAT in response to the fifth clock signal CK180 having the phase of about 180 degrees, the sixth flip-flop 126 may sample the input data DAT in response to the sixth clock signal CK225 having the phase of about 225 degrees, the seventh flip-flop 127 may sample the input data DAT in response to the seventh clock signal CK270 having the phase of about 270 degrees, and the eighth flip-flop 128 may sample the input data DAT in response to the eighth clock signal CK315 having the phase of about 315 degrees.

The first switching block 131 may selectively provide an output signal of the first flip-flop 121, an output signal of the third flip-flop 123, an output signal of the fifth flip-flop 125, or an output signal of the seventh flip-flop 127 to a first input terminal of the first XOR gate 137 in response to the digital code DCODE received from the digital block 180. For example, the digital code DCODE may include first through fourth digital signals D1 through D4, and the first switching block 131 may include first through fourth switches SW1 through SW4. The first switch SW1 may transfer the output signal of the first flip-flop 121 to the first input terminal of the first XOR gate 137 in response to the first digital signal D1, the second switch SW2 may transfer the output signal of the third flip-flop 123 to the first input terminal of the first XOR gate 137 in response to the second digital signal D2, the third switch SW3 may transfer the output signal of the fifth flip-flop 125 to the first input terminal of the first XOR gate 137 in response to the third digital signal D3, and the fourth switch SW4 may transfer the output signal of the seventh flip-flop 127 to the first input terminal of the first XOR gate 137 in response to the fourth digital signal D4.

The second switching block 133 may selectively provide an output signal of the second flip-flop 122, an output signal of the fourth flip-flop 124, an output signal of the sixth flip-flop 126, or an output signal of the eighth flip-flop 128 to a second input terminal of the first XOR gate 137 and a third input terminal of the second XOR gate 139 in response to the digital code DCODE. For example, the second switching block 133 may include fifth through eighth switches SW5 through SW8. The fifth switch SW5 may transfer the output signal of the second flip-flop 122 to the second input terminal of the first XOR gate 137 and the third input terminal of the second XOR gate 139 in response to the first digital signal D1, the sixth switch SW6 may transfer the output signal of the fourth flip-flop 124 to the second input terminal of the first XOR gate 137 and the third input terminal of the second XOR gate 139 in response to the second digital signal D2, the seventh switch SW7 may transfer the output signal of the sixth flip-flop 126 to the second input terminal of the first XOR gate 137 and the third input terminal of the second XOR gate 139 in response to the third digital signal D3, and the eighth switch SW8 may transfer the output signal of the eighth flip-flop 128 to the second input terminal of the first XOR gate 137 and the third input terminal of the second XOR gate 139 in response to the fourth digital signal D4.

The third switching block 135 may selectively provide the output signal of the third flip-flop 123, the output signal of the fifth flip-flop 125, the output signal of the seventh flip-flop 127, or the output signal of the first flip-flop 121 to a fourth input terminal of the second XOR gate 139 in response to the digital code DCODE. For example, the third switching block 135 may include ninth through twelfth switches SW9 through SW12. The ninth switch SW9 may transfer the output signal of the third flip-flop 123 to the fourth input terminal of the second XOR gate 139 in response to the first digital signal D1, the tenth switch SW10 may transfer the output signal of the fifth flip-flop 125 to the fourth input terminal of the second XOR gate 139 in response to the second digital signal D2, the eleventh switch SW11 may transfer the output signal of the seventh flip-flop 127 to the fourth input terminal of the second XOR gate 139 in response to the third digital signal D3, and the twelfth switch SW12 may transfer the output signal of the first flip-flop 121 to the fourth input terminal of the second XOR gate 139 in response to the fourth digital signal D4.

The first XOR gate 137 may receive an output signal of the first switching block 131 at the first input terminal, may receive an output signal of the second switching block 133 at the second input terminal, may generate the up-signal UP by performing an XOR operation on the output signal of the first switching block 131 and the output signal of the second switching block 133, and may output the up-signal UP at a first output terminal.

Further, the second XOR gate 139 may receive the output signal of the second switching block 133 at the third input terminal, may receive an output signal of the third switching block 135 at the fourth input terminal, may generate the down-signal DN by performing an XOR operation on the output signal of the second switching block 133 and the output signal of the third switching block 135, and may output the down-signal DN at a second output terminal.

For example, to operate the multi-rate phase detector 120 at the full rate FULL RATE corresponding to the first data rate DR1 of the input data DAT, the digital block 180 may provide the digital code DCODE of "1000" to the multi-rate phase detector 120 as illustrated in FIG. 4. In this case, the multi-rate phase detector 120 may receive the first digital signal D1 having a high level and the second, third, and fourth digital signal D2, D3, and D4 having a low level. In response, the first switching block 131 may output the output signal of the first flip-flop 121, or the input data DAT sampled at the phase of about 0 degree, the second switching block 133 may output the output signal of the second flip-flop 122, or the input data DAT sampled at the phase of about 45 degrees, and the third switching block 135 may output the output signal of the third flip-flop 123, or the input data DAT sampled at the phase of about 90 degrees. The first XOR gate 137 may generate the up-signal UP by performing the XOR operation on the output signal of the first flip-flop 121, or the input data DAT sampled at the phase of about 0 degree and the output signal of the second flip-flop 122, or the input data DAT sampled at the phase of about 45 degrees. Thus, the up-signal UP may have a high level in a case where the input data DAT have an edge within a phase range of the multi-phase clock signal MPCK from about 0 degree to about 45 degrees. The up-signal UP having the high level may indicate that the input data DAT lead the multi-phase clock signal MPCK, or the second clock signal CK45 having the phase of about 45 degrees, and the phase-locked loop circuit 110 may decrease the phase of the multi-phase clock signal MPCK in response to the up-signal UP having the high level. Further, the second XOR gate 139 may generate the down-signal DN by performing the XOR operation on the output signal of the second flip-flop 122, or the input data DAT sampled at the phase of about 45 degrees and the output signal of the third flip-flop 123, or the input data DAT sampled at the phase of about 90 degrees. Thus, the down-signal DN may have a high level in a case where the input data DAT have an edge within a phase range of the multi-phase clock signal MPCK from about 45 degrees to about 90 degrees. The down-signal DN having the high level may indicate that the multi-phase clock signal MPCK, or the second clock signal CK45 having the phase of about 45 degrees leads the input data DAT, and the phase-locked loop circuit 110 may increase the phase of the multi-phase clock signal MPCK in response to the down-signal DN having the high level.

FIG. 5 shows a timing diagram 310 in a case where the digital code DCODE for operating at the full rate FULL RATE is provided to the multi-rate phase detector 120. When operating at the full rate FULL RATE corresponding to the first data rate DR1 of about 1 Gbps of the input data DAT, the multi-rate phase detector 120 may perform a phase detection operation that detects the phase difference between the input data DAT and the multi-phase clock signal MPCK once per a period PED of the multi-phase clock signal MPCK (e.g., the first clock signal CK0). In some exemplary embodiments, when the multi-rate phase detector 120 operates at the full rate FULL RATE, for example when the phase of the multi-phase clock signal MPCK is adjusted such that the input data DAT have an edge at the phase of about 45 degrees, the multi-rate phase detector 120 may output, as the recovered data RDAT, the output signal of the sixth flip-flop 126, or the input data DAT sampled at the phase of about 225 degrees.

Further, to operate the multi-rate phase detector 120 at the half rate HALF RATE corresponding to the second data rate DR2 of the input data DAT, the digital block 180 may provide the digital code DCODE that sequentially has "1000" and "0010" within one period PED to the multi-rate phase detector 120 as illustrated in FIG. 4. In this case, the multi-rate phase detector 120 may receive the first digital signal D1 having the high level and the second, third, and fourth digital signal D2, D3, and D4 having the low level in the first half of the period PED, and may receive the third digital signal D3 having the high level and the first, second, and fourth digital signal D1, D2, and D4 having the low level in the second half of the period PED. In response, the multi-rate phase detector 120 may output the up-signal UP in a case where the input data DAT have an edge within a phase range from about 0 degree to about 45 degrees, may output the down-signal DN in a case where the input data DAT have an edge within a phase range from about 45 degrees to about 90 degrees, may output the up-signal UP in a case where the input data DAT have an edge within a phase range from about 180 degrees to about 225 degrees, and may output the down-signal DN in a case where the input data DAT have an edge within a phase range from about 225 degrees to about 270 degrees.

FIG. 5 shows a timing diagram 330 of FIG. 5 in a case where the digital code for operating at the half rate HALF RATE is provided to the multi-rate phase detector 120. When operating at the half rate HALF RATE corresponding to the second data rate DR2 of about 2 Gbps of the input data DAT, the multi-rate phase detector 120 may perform the phase detection operation that detects the phase difference between the input data DAT and the multi-phase clock signal MPCK once per a half period of the multi-phase clock signal MPCK, or twice per a period PED of the multi-phase clock signal MPCK. In some exemplary embodiments, when the multi-rate phase detector 120 operates at the half rate HALF RATE, for example when the phase of the multi-phase clock signal MPCK is adjusted such that the input data DAT have edges at the phases of about 45 degrees and about 225 degrees, the multi-rate phase detector 120 may output, as the recovered data RDAT, the output signal of the fourth flip-flop 124, or the input data DAT sampled at the phase of about 135 degrees, and the output signal of the eighth flip-flop 128, or the input data DAT sampled at the phase of about 315 degrees.

Further, to operate the multi-rate phase detector 120 at the quarter rate QUARTER RATE corresponding to the third data rate DR3 of the input data DAT, the digital block 180 may provide the digital code DCODE that sequentially has "1000," "0100," "0010," and "0001" within one period PED to the multi-rate phase detector 120 as illustrated in FIG. 4. In this case, the multi-rate phase detector 120 may receive the first digital signal D1 having the high level and the second, third, and fourth digital signal D2, D3, and D4 having the low level in the first quarter of the period PED, may receive the second digital signal D2 having the high level and the first, third, and fourth digital signal D1, D3, and D4 having the low level in the second quarter of the period PED, may receive the third digital signal D3 having the high level and the first, second, and fourth digital signal D1, D2, and D4 having the low level in the third quarter of the period PED, and may receive the fourth digital signal D4 having the high level and the first, second, and third digital signal D1, D2, and D3 having the low level in the fourth quarter of the period PED. In response, the multi-rate phase detector 120 may output the up-signal UP in a case where the input data DAT have an edge within a phase range from about 0 degree to about 45 degrees, may output the down-signal DN in a case where the input data DAT have an edge within a phase range from about 45 degrees to about 90 degrees, may output the up-signal UP in a case where the input data DAT have an edge within a phase range from about 90 degrees to about 135 degrees, may output the down-signal DN in a case where the input data DAT have an edge within a phase range from about 135 degrees to about 180 degrees, may output the up-signal UP in a case where the input data DAT have an edge within a phase range from about 180 degrees to about 225 degrees, may output the down-signal DN in a case where the input data DAT have an edge within a phase range from about 225 degrees to about 270 degrees, may output the up-signal UP in a case where the input data DAT have an edge within a phase range from about 270 degrees to about 315 degrees, and may output the down-signal DN in a case where the input data DAT have an edge within a phase range from about 315 degrees to about 360 degrees.

FIG. 5 shows a timing diagram 350 in a case where the digital code for operating at the quarter rate QUARTER RATE is provided to the multi-rate phase detector 120. When operating at the quarter rate QUARTER RATE corresponding to the third data rate DR3 of about 4 Gbps of the input data DAT, the multi-rate phase detector 120 may perform the phase detection operation that detects the phase difference between the input data DAT and the multi-phase clock signal MPCK once per a quarter period of the multi-phase clock signal MPCK, or four times per a period PED of the multi-phase clock signal MPCK. In some exemplary embodiments, when the multi-rate phase detector 120 operates at the quarter rate QUARTER RATE, for example when the phase of the multi-phase clock signal MPCK is adjusted such that the input data DAT have edges at the phases of about 45 degrees, about 135 degrees, about 225 degrees and about 315 degrees, the multi-rate phase detector 120 may output, as the recovered data RDAT, the output signal of the first flip-flop 121, or the input data DAT sampled at the phase of about 0 degree, the output signal of the third flip-flop 123, or the input data DAT sampled at the phase of about 90 degrees, the output signal of the fifth flip-flop 125, or the input data DAT sampled at the phase of about 180 degrees, and the output signal of the seventh flip-flop 127, or the input data DAT sampled at the phase of about 270 degrees.

FIG. 2 illustrates an example of the phase-locked loop circuit 110, but it is understood that the phase-locked loop circuit 110 is not limited to the example of FIG. 2. Further, FIG. 3 illustrates an example of a configuration of the multi-rate phase detector 120, but it is understood that the multi-rate phase detector 120 is not limited to the example of FIG. 3.

FIG. 6 illustrates a comparative example in which a CDR circuit does not include the dead zone calibration circuit 200. Due to the lack of the dead zone calibration circuit 200, the multi-phase clock signal MPCK may not be locked at a normal lock point NLP, but a first dead zone DZ1 or a second dead zone DZ2 may exist. For example, 410 in FIG. 6 shows a comparative example of the dead zone calibration operation in which the multi-rate phase detector 120 operates at the full rate FULL RATE corresponding to the first data rate DR1. In a case where the multi-phase clock signal MPCK, for example the second clock signal CK45 has a time difference from about 0 unit interval (UI) to about 0.125 UI with respect to the input data DAT, or has a phase greater than that of the input data DAT by a phase difference from about 0 degree to about 45 degrees, the up-signal UP may have a level higher than that of the down-signal DN, the positive charge pump current ICP may be provided, and the phase of the multi-phase clock signal MPCK may be decreased. Here, the unit interval (UI) may correspond to a width or a time interval of each bit of the input data DAT. Further, in another case where the second clock signal CK45 has a time difference from about −0.125 UI to about 0 UI with respect to the input data DAT, or has a phase less than that of the input data DAT by a phase difference from about 0 degree to about 45 degrees, the down-signal DN may have a level higher than that of the up-signal UP, the negative charge pump current ICP may be provided, and the phase of the multi-phase clock signal MPCK may be increased. Accordingly, in a case where the second clock signal CK45 has a time difference from about −0.125 UI to about 0.125 UI (or a time difference from about 0 UI to about 0.125 UI and from about 0.875 UI to about 1 UI) or a phase difference from about −45 degrees to about 45 degrees (or a phase difference from about 0 degree to about 45 degrees and from about 315 degrees to about 360 degrees) with respect to the input data DAT, the multi-phase clock signal MPCK may be adjusted such that the second clock signal CK45 has a time difference of about 0 UI or a phase difference of about 0 degree with respect to the input data DAT, and may be locked at the normal lock point NLP. However, in a case where the second clock signal CK45 has a time difference from about 0.125 UI to about 0.875 UI or a phase difference from about 45 degrees to about 315 degrees with respect to the input data DAT, the charge pump current ICP may not be generated, the multi-phase clock signal MPCK may not be adjusted, and the multi-phase clock signal MPCK may not be locked at the normal lock point NLP. Accordingly, when the multi-rate phase detector 120 operates at the full rate FULL RATE, the first dead zone DZ1 from about 45 degrees to about 315 degrees may exist.

Further, 430 in FIG. 6 shows a comparative example of the dead zone calibration operation in which the multi-rate phase detector 120 operates at the half rate HALF RATE corresponding to the second data rate DR2. In a case where the multi-phase clock signal MPCK, for example the second clock signal CK45 has a time difference from about 0 UI to about 0.25 UI and from about 0.75 UI to about 1 UI, or a phase difference from about 0 degree to about 90 degrees and from about 270 degrees to about 360 degrees with respect to the input data DAT, the multi-phase clock signal MPCK may be locked at the normal lock point NLP. However, when the multi-rate phase detector 120 operates at the half rate HALF RATE, the second dead zone DZ2 from about 90 degrees to about 270 degrees may exist.

Further, 450 in FIG. 6 shows a comparative example of the dead zone calibration operation in which the multi-rate phase detector 120 operates at the quarter rate QUARTER RATE corresponding to the third data rate DR3. In this case, the multi-phase clock signal MPCK may be locked at the normal lock point NLP, and the dead zone may not exist.

However, in the CDR circuit 100 including the dead zone calibration circuit 200, to prevent the multi-phase clock signal MPCK from being locked within the first and second dead zones DZ1 and DZ2, the multi-rate phase detector 120 may operate at an initial rate that is previously determined regardless of the data rate of the input data DAT in an initial period. After the multi-phase clock signal MPCK is locked, the multi-rate phase detector 120 may operate at an operational rate corresponding to the data rate of the input data DAT, and the dead zone calibration circuit 200 may perform the dead zone calibration operation that changes the phase of the multi-phase clock signal MPCK that may be locked within the first and second dead zones DZ1 and DZ2.

According to one embodiment, the multi-rate phase detector 120 may operate at the full rate FULL RATE as the initial rate regardless of the data rate DR1, DR2, and DR3 of the input data DAT in the initial period. In some exemplary embodiments, the initial period may be, but is not limited to, a time period from a time point at which the input data DAT are started to be transferred to a time point at which the multi-phase clock signal MPCK is locked. In the initial period, regardless of whether the input data DAT are received at the first data rate DR1 of about 1 Gbps, at the second data rate DR2 of about 2 Gbps, or at the third data rate DR3 of about 4 Gbps, the digital block 180 may provide the digital code DCODE of "1000" to the multi-rate phase detector 120. FIG. 7 shows a timing diagram 510 in which the multi-rate phase detector 120 may perform the phase detection operation using the first, second, and third clock signals CK0, CK45, and CK90 with respect to the input data DAT received at the first data rate DR1 of about 1 Gbps, a timing diagram 530 in which the multi-rate phase detector 120 may perform the phase detection operation using the first, second and third clock signals CK0, CK45 and CK90 with respect to the input data DAT received at the second data rate DR2 of about 2 Gbps, and a timing diagram 550 in which the multi-rate phase detector 120 may perform the phase detection operation using the first, second, and third clock signals CK0, CK45, and CK90 with respect to the input data DAT received at the third data rate DR3 of about 4 Gbps. Accordingly, regardless of the data rate DR1, DR2, and DR3 of the input data DAT, the multi-phase clock signal MPCK may be locked within a first phase range of the multi-phase clock signal MPCK from about 0 degree to about 90 degrees.

Referring to FIGS. 1 and 2, if the multi-phase clock signal MPCK is locked in the initial period, the lock detector 170 may generate a lock-enable signal LOCK_EN by detecting a lock state of the phase-locked loop circuit 110. For example, the lock detector 170 may generate the lock-enable signal LOCK_EN when the control voltage VC provided to the voltage-controlled oscillator 160 has a substantially constant voltage level for a predetermined time.

The dead zone calibration circuit 200 may determine the operational rate corresponding to the data rate of the input data DAT among the plurality of rates DR1, DR2, and DR3 in response to the lock-enable signal LOCK_EN. For example, the dead zone calibration circuit 200 may determine that the operational rate is the full rate FULL RATE when the data rate of the input data DAT is the first data rate DR1, may determine that the operational rate is the half rate HALF RATE when the data rate of the input data DAT is the second data rate DR2 that is double of the first data rate DR1, and may determine that the operational rate is the quarter rate QUARTER RATE when the data rate of the input data DAT is the third data rate DR3 that is double of the second data rate DR2.

In some exemplary embodiments, a phase range of the multi-phase clock signal MPCK from about 0 degree to about 360 degrees corresponding to one period PED of the multi-phase clock signal MPCK may be divided into a first phase range from about 0 degree to about 90 degrees, a second phase range from about 90 degrees to about 180 degrees, a third phase range from about 180 degrees to about 270 degrees, and a fourth phase range from about 270 degrees to about 360 degrees, and the multi-phase clock signal MPCK may be locked within the first phase range from about 0 degree to about 90 degrees by the multi-rate phase detector 120 operating at the initial rate, for example at the full rate FULL RATE in the initial period. The dead zone calibration circuit 200 may detect a first edge of the input data DAT within the second phase range from about 90 degrees to about 180 degrees and a second edge of the input data DAT within the third phase range from about 180 degrees to about 270 degrees. Further, the dead zone calibration circuit 200 may determine that the operational rate is the full rate FULL RATE in response to the lock-enable signal LOCK_EN when the first edge and the second edge are not detected, may determine that the operational rate is the half rate HALF RATE in response to the lock-enable signal LOCK_EN when the first edge is not detected and the second edge is detected, and may determine that the operational rate is the quarter rate QUARTER RATE in response to the lock-enable signal LOCK_EN when both the first edge and the second edge are detected.

The digital block 180 may control the multi-rate phase detector 120 to operate at the operational rate as determined by the dead zone calibration circuit 200. For example, the digital block 180 may provide the multi-rate phase detector 120 with the digital code DCODE of "1000" when the operational rate is determined as the full rate FULL RATE, may provide the multi-rate phase detector 120 with the digital code DCODE that sequentially has "1000" and "0010" within one period PED when the operational rate is determined as the half rate HALF RATE, and may provide the multi-rate phase detector 120 with the digital code DCODE that sequentially has "1000," "0100," "0010," and "0001" within one period PED when the operational rate is determined as quarter rate QUARTER RATE. The digital block 180 may generate a calibration-enable signal CAL_EN and provide it to the dead zone calibration circuit 200. In some exemplary embodiments, after the operational rate of the multi-rate phase detector 120 is determined, the calibration-enable signal CAL_EN may continuously have a high level. In other exemplary embodiments, after the operational rate is determined, the calibration-enable signal CAL_EN may periodically or aperiodically have the high level.

The dead zone calibration circuit 200 may perform the dead zone calibration operation in response to the calibration-enable signal CAL_EN. In some exemplary embodiments, in response to the calibration-enable signal CAL_EN, the dead zone calibration circuit 200 may determine whether the multi-phase clock signal MPCK is locked within the dead zone, and may change the phase of the multi-phase clock signal MPCK when the multi-phase clock signal MPCK is locked within the dead zone.

In some exemplary embodiments, the dead zone calibration circuit 200 may further detect a third edge of the input data DAT within the fourth phase range from about 270 degrees to about 360 degrees. In a case where the operational rate is determined as the full rate FULL RATE, in response to the calibration-enable signal CAL_EN, the dead zone calibration circuit 200 may determine that the multi-phase clock signal MPCK is locked within the dead zone when the first edge, the second edge, or the third edge is detected, and may determine that the multi-phase clock signal MPCK is not locked within the dead zone when none of the first edge, the second edge, and the third edge is detected. Further, in a case where the operational rate is determined as the half rate HALF RATE, in response to the calibration-enable signal CAL_EN, the dead zone calibration circuit 200 may determine that the multi-phase clock signal MPCK is locked within the dead zone when the first edge or the third edge is detected, and may determine that the multi-phase clock signal MPCK is not locked within the dead zone when neither the first edge nor the third edge is detected. Further, in a case where the operational rate is determined as the quarter rate QUARTER RATE, in response to the calibration-enable signal CAL_EN, the dead zone calibration circuit 200 may determine that the multi-phase clock signal MPCK is not locked within the dead zone. If it is determined that the multi-phase clock signal MPCK is locked within the dead zone, the dead zone calibration circuit 200 may provide an additional charge pump current IACP to the loop filter 150 included in the phase-locked loop circuit 110 to change the phase of the multi-phase clock signal MPCK.

Referring to FIG. 8, the dead zone calibration circuit 200 may include an edge detection block 210, a rate determination block 230, a dead zone detection block 250, and a dead zone charge pump 280. The dead zone calibration circuit 200 may determine the operational rate and perform the dead zone calibration operation.

The edge detection block 210 may detect the first edge of the input data DAT within the second phase range about 90 degrees to about 180 degrees, the second edge of the input data DAT within the third phase range from about 180 degrees to about 270 degrees, and the third edge of the input data DAT within the fourth phase range from about 270 degrees to about 360 degrees.

The edge detection block 210 may include a first flip-flop 211 that samples the input data DAT in response to the third clock signal CK90 having the phase of about 90 degrees, a second flip-flop 212 that samples the input data DAT in response to the fifth clock signal CK180 having the phase of about 180 degrees, a third flip-flop 213 that samples the input data DAT in response to the seventh clock signal CK270 having the phase of about 270 degrees, a fourth flip-flop 214 that samples the input data DAT in response to the first clock signal CK0 having the phase of about 0 degree, or the phase of about 360 degrees. The edge detection block 210 may further include a first XOR gate 221 that detects the first edge by performing an XOR operation on an output signal of the first flip-flop 211 and an output signal of the second flip-flop 212, a second XOR gate 222 that detects the second edge by performing an XOR operation on the output signal of the second flip-flop 212 and an output signal of the third flip-flop 213, and a third XOR gate 223 that detects the third edge by performing an XOR operation on the output signal of the third flip-flop 213 and an output signal of the fourth flip-flop 214. In some exemplary embodiments, the edge detection block 210 may further include fifth through tenth flip-flops 215 through 220 for aligning the output signals of the first through fourth flip-flops 211 through 214. For example, the fifth flip-flop 215 may be located between the first flip-flop 211 and the first XOR gate 221, and may sample the output signal of the first flip-flop 211 in response to the fourth clock signal CK135 having the phase of about 135 degrees. The sixth flip-flop 216 may be located between the second flip-flop 212 and the first XOR gate 221, and may sample the output signal of the second flip-flop 212 in response to the sixth clock signal CK225 having the phase of about 225 degrees. The seventh flip-flop 217 may be located between the second flip-flop 212 and the second XOR gate 222, and may sample the output signal of the second flip-flop 212 in response to the sixth clock signal CK225 having the phase of about 225 degrees. The eighth flip-flop 218 may be located between the third flip-flop 213 and the second XOR gate 222, and may sample the output signal of the third flip-flop 213 in response to the sixth clock signal CK225 having the phase of about 225 degrees. The ninth flip-flop 219 may be located between the third flip-flop 213 and the third XOR gate 223, and may sample the output signal of the third flip-flop 213 in response to the eighth clock signal CK315 having the phase of about 315 degrees. The tenth flip-flop 220 may be located between the fourth flip-flop 214 and the third XOR gate 223, and may sample the output signal of the fourth flip-flop 214 in response to the eighth clock signal CK315 having the phase of about 315 degrees.

The rate determination block 230 may determine the operational rate based on the lock-enable signal LOCK_EN, an output signal of the first XOR gate 221, or the first edge, and an output signal of the second XOR gate 222, or the second edge.

The rate determination block 230 may include a first multiplexer 231 that selectively outputs the output signal of the first XOR gate 221 or a low power supply voltage VSS in response to the lock-enable signal LOCK_EN, a second multiplexer 232 that selectively outputs the output signal of the second XOR gate 222 or the low power supply voltage VSS in response to the lock-enable signal LOCK_EN, an eleventh flip-flop 241 that generates a first rate detection signal RDS1 by sampling a high power supply voltage VDD in response to an output signal of the first multiplexer 231, and a twelfth flip-flop 242 that generates a second rate detection signal RDS2 by sampling the high power supply voltage VDD in response to an output signal of the second multiplexer 232.

Referring to FIG. 9, the first rate detection signal RDS1 having a low level and the second rate detection signal RDS2 having the low level may indicate that the first edge and the second edge are not detected, or that the input data DAT are received at the first data rate DR1. Accordingly, in a case where both of the first rate detection signal RDS1 and the second rate detection signal RDS2 have the low level, the digital block 180 may control the multi-rate phase detector 120 to operate at the full rate FULL RATE corresponding to the first data rate DR1 as the operational rate. Further, the first rate detection signal RDS1 having the low level and the second rate detection signal RDS2 having a high level may indicate that the first edge is not detected but the second edge is detected, or that the input data DAT are received at the second data rate DR2 that is double of the first data rate DR1. Accordingly, in a case where the first rate detection signal RDS1 has the low level and the second rate detection signal RDS2 has the high level, the digital block 180 may control the multi-rate phase detector 120 to operate at the half rate HALF RATE corresponding to the second data rate DR2 as the operational rate. Further, the first rate detection signal RDS1 having the high level and the second rate detection signal RDS2 having the high level may indicate that both the first edge and the second edge are detected, or that the input data DAT are received at the third data rate DR3 that is double of the second data rate DR2. Accordingly, in a case where the first rate detection signal RDS1 has the high level and the second rate detection signal RDS2 has the high level, the digital block 180 may control the multi-rate phase detector 120 to operate at the quarter rate QUARTER RATE corresponding to the third data rate DR3 as the operational rate.

The dead zone detection block 250 may determine whether the multi-phase clock signal MPCK is locked within the dead zone based on the calibration-enable signal CAL_EN, the operational rate, the first edge, the second edge, and the third edge.

Referring to FIG. 8, the dead zone detection block 250 may include a third multiplexer 251 that selectively outputs the output signal of the first XOR gate 221 or the low power supply voltage VSS as a first calibration signal CAL1 in response to the calibration-enable signal CAL_EN, a fourth multiplexer 252 that selectively outputs the output signal of the second XOR gate 222 or the low power supply voltage VSS as a second calibration signal CAL2 in response to the calibration-enable signal CAL_EN, a fifth multiplexer 253 that selectively outputs an output signal of the third XOR gate 223 or the low power supply voltage VSS as a third calibration signal CAL3 in response to the calibration-enable signal CAL_EN, a first OR gate 261 that outputs a full rate calibration signal FULL_CAL by performing an OR operation on the first calibration signal CAL1, the second calibration signal CAL2, and the third calibration signal CAL3, a second OR gate 262 that outputs a half rate calibration signal HALF_CAL by performing an OR operation on the first calibration signal CAL1 and the third calibration signal CAL3, and a sixth multiplexer 270 that selectively outputs the full rate calibration signal FULL_CAL, the half rate calibration signal HALF_CAL, or the low power supply voltage VSS as a dead zone detection signal DZDS in response to an operational rate signal FRATES corresponding to the operational rate.

The first calibration signal CAL1 having a high level may indicate that the input data DAT have the first edge within the second phase range from about 90 degrees to about 180 degrees, the second calibration signal CAL2 having the high level may indicate that the input data DAT have the second edge within the third phase range from about 180 degrees to about 270 degrees, and the third calibration signal CAL3 having the high level may indicate that the input data DAT have the third edge within the fourth phase range from about 270 degrees to about 360 degrees. Further, the first OR gate 261 may output the full rate calibration signal FULL_CAL having a high level when any one of the first calibration signal CAL1, the second calibration signal CAL2, and the third calibration signal CAL3 has the high level, and the second OR gate 262 may output the half rate calibration signal HALF_CAL having the high level when any one of the first calibration signal CAL1 and the third calibration signal CAL3 has the high level. Further, the sixth multiplexer 270 may output the full rate calibration signal FULL_CAL as the dead zone detection signal DZDS in response to the operational rate signal FRATES corresponding to the full rate FULL RATE, may output the half rate calibration signal HALF_CAL as the dead zone detection signal DZDS in response to the operational rate signal FRATES corresponding to the half rate HALF RATE, and may output the low power supply voltage VSS as the dead zone detection signal DZDS in response to the operational rate signal FRATES corresponding to the quarter rate QUARTER RATE.

Referring to FIG. 10, in a case where the operational rate signal FRATES corresponds to the full rate FULL RATE, the dead zone detection block 250 may output the dead zone detection signal DZDS having a low level when all of the first calibration signal CAL1, the second calibration signal CAL2 and the third calibration signal CAL3 have the low level, and may output the dead zone detection signal DZDS having a high level when any one of the first calibration signal CAL1, the second calibration signal CAL2, and the third calibration signal CAL3 has the high level. Further, in a case where the operational rate signal FRATES corresponds to the half rate HALF RATE, the dead zone detection block 250 may output the dead zone detection signal DZDS having the low level when both of the first calibration signal CAL1 and the third calibration signal CAL3 have the low level, and may output the dead zone detection signal DZDS having the high level when any one of the first calibration signal CAL1 and the third calibration signal CAL3 has the high level. Further, in a case where the operational rate signal FRATES corresponds to the quarter rate QUARTER RATE, the dead zone detection block 250 may output the dead zone detection signal DZDS having the low level regardless of the first calibration signal CAL1, the second calibration signal CAL2, and the third calibration signal CAL3.

The dead zone charge pump 280 may provide the additional charge pump current IACP to the loop filter 150 included in the phase-locked loop circuit 110 when it is determined that the multi-phase clock signal MPCK is locked within a dead zone. The dead zone charge pump 280 may not provide the additional charge pump current IACP to the loop filter 150 in a case where the dead zone detection signal DZDS has the low level, and may provide the additional charge pump current IACP to the loop filter 150 in a case where the dead zone detection signal DZDS has the high level. In some exemplary embodiments, the additional charge pump current IACP may be a negative current, and the phase-locked loop circuit 110 may increase the phase of the multi-phase clock signal MPCK based on the additional charge pump current IACP that is provided by the dead zone charge pump 280.

For example, 610 in FIG. 11 shows an example of the dead zone calibration operation in which the multi-rate phase detector 120 operates at the full rate FULL RATE, Even if the multi-phase clock signal MPCK is locked within the first dead zone DZ1 from about 45 degrees to about 315 degrees, the phase of the multi-phase clock signal MPCK may be increased by the additional charge pump current IACP, and the multi-phase clock signal MPCK may be locked at the normal lock point NLP. Further, 630 in FIG. 11 shows an example of the dead zone calibration operation in which the multi-rate phase detector 120 operates at the half rate HALF RATE, Even if the multi-phase clock signal MPCK is locked within the second dead zone DZ2 from about 90 degrees to about 270 degrees, the phase of the multi-phase clock signal MPCK may be increased by the additional charge pump current IACP, and the multi-phase clock signal MPCK may be locked at the normal lock point NLP. Further, 650 in FIG. 11 shows an example of the dead zone calibration operation in which the multi-rate phase detector 120 operates at the quarter rate QUARTER RATE. No dead zone may exist, and the multi-phase clock signal MPCK may be locked at the normal lock point NLP.

As described above, the CDR circuit 100 may include the multi-rate phase detector 120 that may operate at the full rate FULL RATE in the initial period, the dead zone calibration circuit 200 that may determine the operational rate corresponding to the data rate DR1, DR2, and DR3 in response to the lock-enable signal LOCK_EN, the multi-rate phase detector 120 that may operate at the operational rate after the initial period, and the dead zone calibration circuit 200 that may perform the dead zone calibration operation that changes the phase of the multi-phase clock signal MPCK in a case where the multi-phase clock signal MPCK is locked within the dead zone in response to the calibration-enable signal CAL_EN. Accordingly, the multi-phase clock signal MPCK may be prevented from being locked within the dead zone, and an error of the recovered data RDAT may be prevented by sampling the input data DAT in response to the multi-phase clock signal MPCK. Further, since the CDR circuit 100 employs the multi-rate phase detector 120, the CDR circuit 100 may have a small size and small power consumption compared with a CDR circuit including a multi-rate voltage-controlled oscillator.

Figure 12:
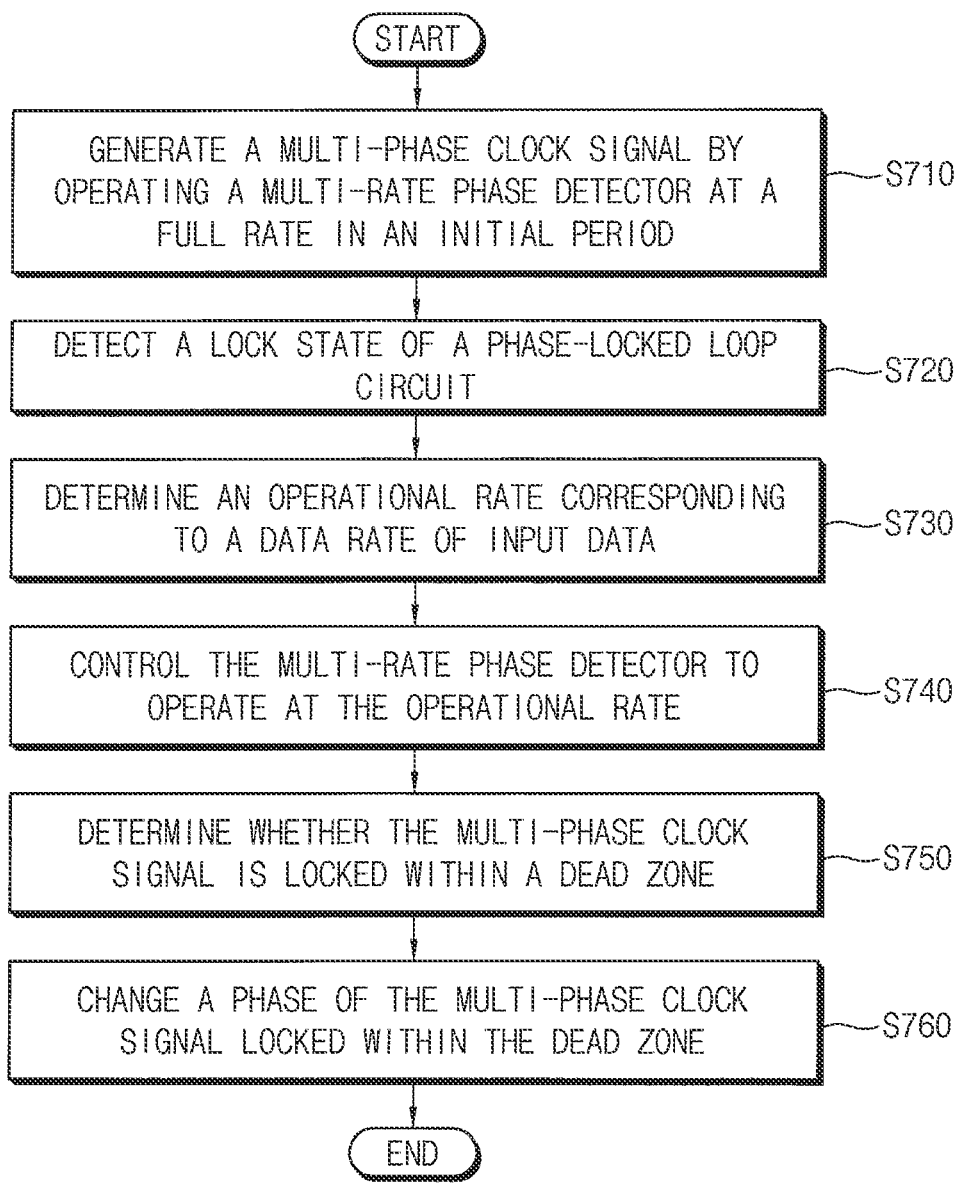
FIG. 12 is a flowchart of operating a CDR circuit according to an exemplary embodiment.

FIG. 12 is a flowchart of operating a CDR circuit according to an exemplary embodiment.

Referring to FIGS. 1 and 12, in the CDR circuit 100 included in a data driver of a display device, the phase-locked loop circuit 110 may generate the multi-phase clock signal MPCK based on the input data DAT while the multi-rate phase detector 120 that is operable at a plurality of rates may operate at an initial rate that is a predetermined one of the plurality of rates in an initial period (S710). In some exemplary embodiments, the plurality of rates of the multi-rate phase detector 120 may include the full rate FULL RATE, the half rate HALF RATE, and the quarter rate QUARTER RATE, and the initial rate may be the full rate FULL RATE.

The lock detector 170 may detect a lock state of the phase-locked loop circuit 110, and may generate the lock-enable signal LOCK_EN based on the lock state (S720). The dead zone calibration circuit 200 may determine an operational rate corresponding to a data rate of the input data DAT among the plurality of rates in response to the lock-enable signal LOCK_EN (S730).

The digital block 180 may control the multi-rate phase detector 120 to operate at the operational rate (S740). Further, the digital block 180 may generate the calibration-enable signal CAL_EN. The dead zone calibration circuit 200 may determine whether the multi-phase clock signal MPCK is locked within a dead zone in response to the calibration-enable signal CAL_EN (S750). In a case where the multi-phase clock signal MPCK is locked within the dead zone, the dead zone calibration circuit 200 may change a phase of the multi-phase clock signal MPCK (S760). Accordingly, the multi-phase clock signal MPCK may be prevented from being locked within the dead zone, and an error of the recovered data RDAT may be prevented by sampling the input data DAT in response to the multi-phase clock signal MPCK. Further, since the CDR circuit 100 employs the multi-rate phase detector 120, the CDR circuit 100 may have a small size and small power consumption.

Figure 13:
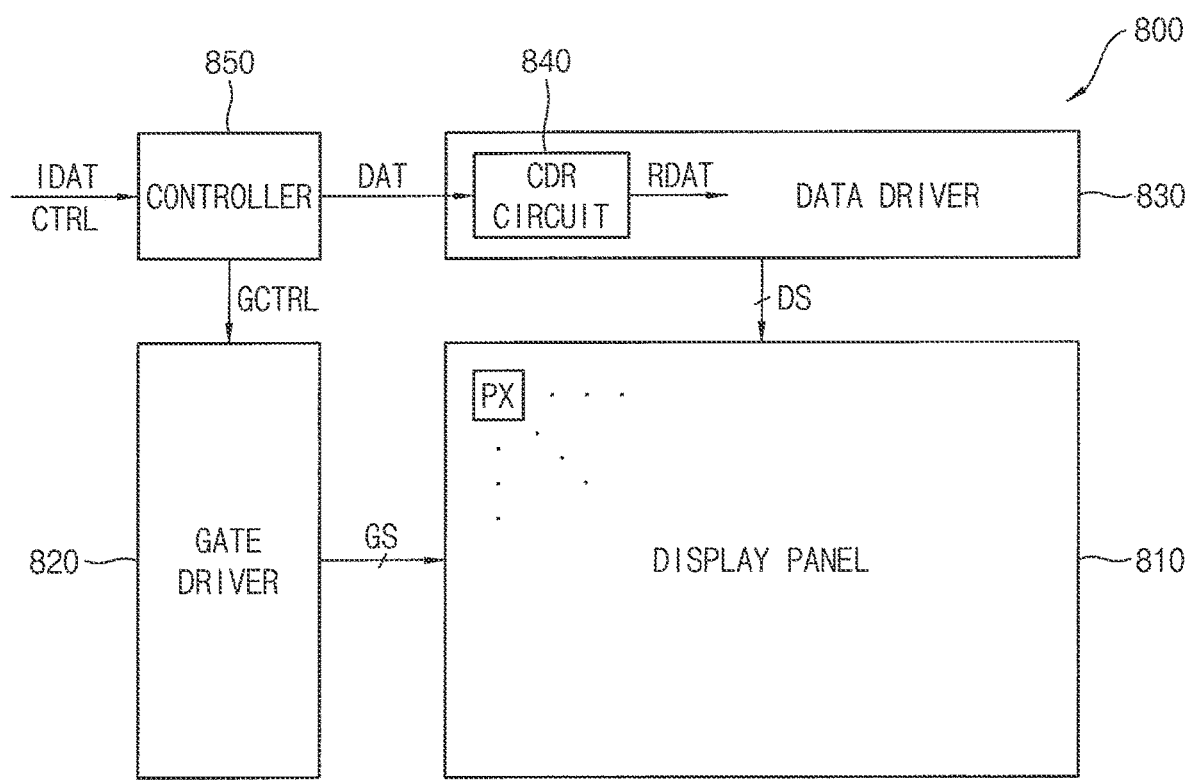
FIG. 13 is a block diagram of a display device according to an exemplary embodiment.

FIG. 13 is a block diagram of a display device according to an exemplary embodiment.

Referring to FIG. 13, a display device 800 may include a display panel 810 that includes a plurality of pixels PX, a gate driver 820 that provides gate signals GS to the plurality of pixels PX, a data driver 830 that provides data signals DS to the plurality of pixels PX, and a controller 850 that controls the gate driver 820 and the data driver 830.

The display panel 810 may include a plurality of data lines, a plurality of gate lines, and the plurality of pixels PX coupled to the plurality of data lines and the plurality of gate lines. In some exemplary embodiments, the display panel 810 may be a liquid crystal display (LCD) panel, and each pixel PX may include a switching transistor, and a liquid crystal capacitor coupled to the switching transistor. In other exemplary embodiments, the display panel 810 may be an OLED display panel, and each pixel PX may include at least two transistors, at least one capacitor and an organic light emitting diode (OLED). However, it is understood that the display panel 810 is not limited to the LCD panel and the OLED display panel, and may be any other suitable display panel.

The gate driver 820 may generate the gate signals GS based on a gate control signal GCTRL received from the controller 850, and may provide the gate signals GS to the plurality of pixels PX through the plurality of gate lines. In some exemplary embodiments, the gate control signal GCTRL may include, but is not limited to, a gate start signal and a gate clock signal. In some exemplary embodiments, the gate driver 820 may be implemented as an amorphous silicon gate (ASG) driver integrated in a peripheral portion of the display panel 810. In other exemplary embodiments, the gate driver 820 may be implemented with one or more gate integrated circuits (ICs). Further, according to some exemplary embodiments, the gate driver 820 may be mounted directly on the display panel 810, or may be coupled to the display panel 810 in a form of a chip on film (COF).

The data driver 830 may include a CDR circuit 840 that receives the input data DAT from the controller 850. The CDR circuit 840 may generate the multi-phase clock signal MPCK based on the input data DAT, and may generate the recovered data RDAT by sampling the input data DAT based on the multi-phase clock signal MPCK. In some exemplary embodiments, the CDR circuit 840 may be the CDR circuit 100 of FIG. 1. The data driver 830 may generate the data signals DS based on the recovered data RDAT, and may provide the data signals DS to the plurality of pixels PX through the plurality of data lines. In some exemplary embodiments, the data driver 830 may be implemented with one or more data driver ICs. According to some exemplary embodiments, the data driver ICs may be mounted directly on the display panel 810, or may be coupled to the display panel 810 in the form of the COF. In other exemplary embodiments, the data driver 830 may be integrated in the peripheral portion of the display panel 810.

The controller 850 (e.g., a timing controller (TCON)) may receive input image data IDAT and a control signal CTRL from an external host processor (e.g., a graphic processing unit (GPU), a graphic card, etc.). In some exemplary embodiments, the input image data IDAT may be RGB image data including red image data, green image data, and blue image data. The controller 850 may convert the input image data IDAT into the input data DAT having a format suitable for the data driver 830. In some exemplary embodiments, the control signal CTRL may include, but is not limited to, a vertical synchronization signal, a horizontal synchronization signal, an input data enable signal, a master clock signal, or the like. The controller 850 may generate the input data DAT and the gate control signal GCCTL based on the input image data IDAT and the control signal CTRL. The controller 850 may control an operation of the gate driver 820 by providing the gate control signal GCTRL to the gate driver 820, and may control an operation of the data driver 830 by providing the input data DAT to the data driver 830.

In the display device 800, a multi-rate phase detector (e.g., the multi-rate phase detector 120 of FIG. 1) of the CDR circuit 840 may operate at a full rate in an initial period, a dead zone calibration circuit (e.g., the dead zone calibration circuit 200 of FIG. 1) of the CDR circuit 840 may determine an operational rate corresponding to a data rate of the input data DAT in response to a lock-enable signal, the multi-rate phase detector may operate at the operational rate after the initial period, and the dead zone calibration circuit may perform a dead zone calibration operation that changes a phase of the multi-phase clock signal MPCK when the multi-phase clock signal MPCK is locked within a dead zone in response to a calibration-enable signal. Accordingly, the multi-phase clock signal MPCK may be prevented from being locked within the dead zone, and an error of the recovered data RDAT may be prevented by sampling the input data DAT in response to the multi-phase clock signal MPCK. Further, since the CDR circuit 840 employs the multi-rate phase detector, the CDR circuit 840 may have a small size and small power consumption.

Figure 14:
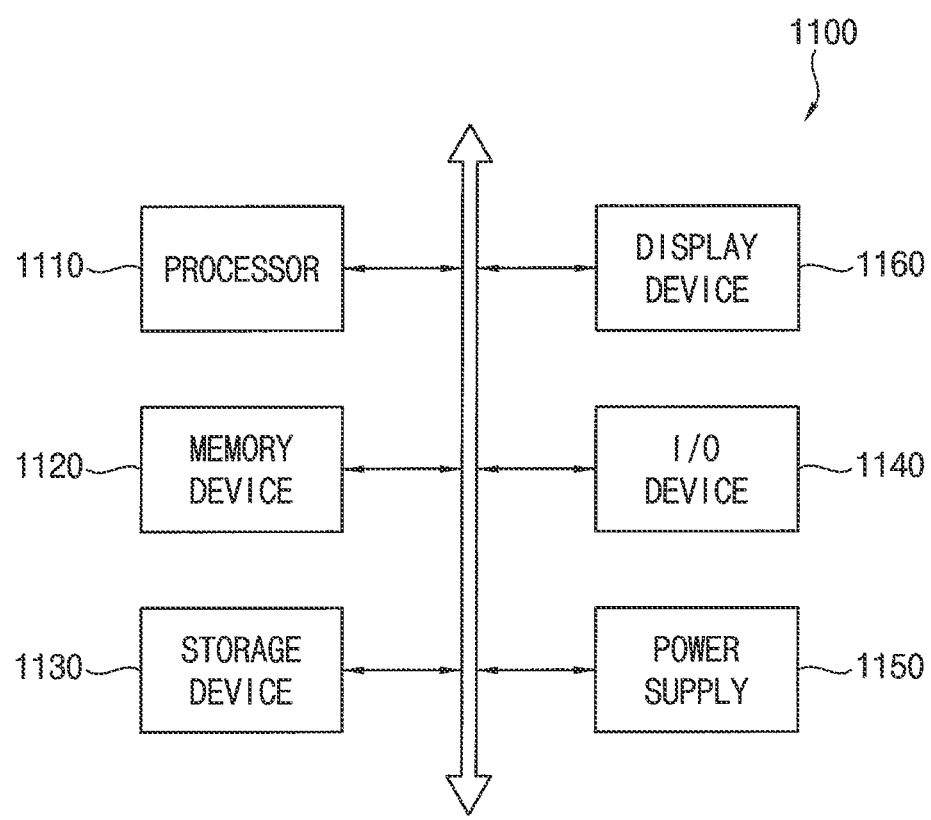
FIG. 14 is a block diagram of an electronic device including a display device according to an exemplary embodiment.

FIG. 14 is a block diagram of an electronic device including a display device according to an exemplary embodiment.

Referring to FIG. 14, an electronic device 1100 may include a processor 1110, a memory device 1120, a storage device 1130, an input/output (I/O) device 1140, a power supply 1150, and a display device 1160. The electronic device 1100 may further include a plurality of ports for communicating with various peripheral devices including, but not limited to, a video card, a sound card, a memory card, a universal serial bus (USB) device, other electric devices, etc.

The processor 1110 may perform various computing functions or tasks. The processor 1110 may be an application processor (AP), a microprocessor, a central processing unit (CPU), etc. The processor 1110 may be coupled to other components of the electronic device 1100 via an address bus, a control bus, a data bus, etc. Further, in some exemplary embodiments, the processor 1110 may be further coupled to an extended bus such as a peripheral component interconnection (PCI) bus.

The memory device 1120 may store data for operating the electronic device 1100. For example, the memory device 1120 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc., and/or at least one volatile memory device such as a dynamic random access memory (DRAM) device, a static random access memory (SRAM) device, a mobile dynamic random access memory (mobile DRAM) device, etc.

The storage device 1130 may be a solid state drive (SSD) device, a hard disk drive (HDD) device, a CD-ROM device, etc. The I/O device 1140 may be an input device such as a keyboard, a keypad, a mouse, a touch screen, etc., and an output device such as a printer, a speaker, etc. The power supply 1150 may supply power for operating the electronic device 1100. The display device 1160 may be coupled to other components through the buses or other communication links.

The display device 1160 may be the display device 800 of FIG. 13. The display device 1160 may include a multi-rate phase detector (e.g., the multi-rate phase detector 120 of FIG. 1) of a CDR circuit (e.g., the CDR circuit 100 of FIG. 1, and 840 of FIG. 13) in a data driver that may operate at a full rate in an initial period, a dead zone calibration circuit (e.g., the dead zone calibration circuit 200 of FIG. 1) of the CDR circuit that may determine an operational rate corresponding to a data rate of the input data DAT in response to a lock-enable signal, the multi-rate phase detector that may operate at the operational rate after the initial period, and the dead zone calibration circuit that may perform a dead zone calibration operation that changes a phase of a multi-phase clock signal MPCK in a case where the multi-phase clock signal MPCK is locked within a dead zone in response to a calibration-enable signal. Accordingly, the multi-phase clock signal MPCK may be prevented from being locked within the dead zone, and an error of the recovered data may be prevented by sampling the input data DAT in response to the multi-phase clock signal. Further, since the CDR circuit employs the multi-rate phase detector, the CDR circuit may have a small size and small power consumption.

The inventive concepts of the present disclosure may be applied any electronic device 1100 including the display device 1160. For example, the inventive concepts may be applied to a television (TV), a digital TV, a three-dimensional (3D) TV, a mobile phone, a smart phone, a tablet computer, a virtual reality (VR) device, a wearable electronic device, a personal computer (PC), a home appliance, a laptop computer, a personal digital assistant (PDA), a portable multimedia player (PMP), a digital camera, a music player, a portable game console, a navigation device, etc.

The foregoing is illustrative of exemplary embodiments of the present disclosure and is not to be construed as limiting thereof. Although some exemplary embodiments have been described, those skilled in the art will readily appreciate that deviations and/or modifications are possible in the exemplary embodiments without materially departing from the novel teachings and advantages of the present inventive concept. Accordingly, such deviations and/or modifications are intended to be included within the scope of the present inventive concept of the present disclosure including the claims. Therefore, it is to be understood that the foregoing is illustrative of various exemplary embodiments and is not to be construed as limited to the specific exemplary embodiments disclosed, and that deviations and/or modifications to the disclosed exemplary embodiments, as well as other exemplary embodiments, are intended to be included within the scope of the present disclosure including the appended claims.

What is claimed is:

1. A clock data recovery (CDR) circuit comprising:
a phase-locked loop circuit configured to generate a multi-phase clock signal based on input data, the phase-locked loop circuit including a multi-rate phase detector being operable at a plurality of rates, the multi-rate phase detector configured to operate at an initial rate that is a predetermined one of the plurality of rates in an initial period;
a lock detector configured to generate a lock-enable signal by detecting a lock state of the phase-locked loop circuit;
a dead zone calibration circuit configured to determine an operational rate corresponding to a data rate of the input data among the plurality of rates in response to the lock-enable signal; and
a digital block configured to control the multi-rate phase detector to operate at the operational rate and generate a calibration-enable signal,
wherein the dead zone calibration circuit determines whether the multi-phase clock signal is locked within a dead zone in response to the calibration-enable signal, and changes a phase of the multi-phase clock signal based on the multi-phase clock signal being locked within the dead zone.

2. The CDR circuit of claim 1, wherein the plurality of rates includes a full rate where the multi-rate phase detector performs a phase detection operation per a full period of the multi-phase clock signal, a half rate where the multi-rate phase detector performs the phase detection operation per a half period of the multi-phase clock signal, and a quarter rate where the multi-rate phase detector performs the phase detection operation per a quarter period of the multi-phase clock signal, and
wherein the initial rate is the full rate.

3. The CDR circuit of claim 2, wherein the data rate of the input data is one of a first data rate, a second data rate that is double of the first data rate, and a third data rate that is double of the second data rate, and
wherein the dead zone calibration circuit is configured to determine, in response to the lock-enable signal, that:
the operational rate is the full rate based on the data rate of the input data being the first data rate;
the operational rate is the half rate based on the data rate of the input data being the second data rate; and the operational rate is the quarter rate based on the data rate of the input data being the third data rate.

4. The CDR circuit of claim 2, wherein a phase range of the multi-phase clock signal corresponding to one period of the multi-phase clock signal is divided into a first phase range, a second phase range, a third phase range, and a fourth phase range, and the multi-phase clock signal is locked within the first phase range by the multi-rate phase detector operating at the initial rate, and wherein the dead zone calibration circuit is configured to detect a first edge of the input data within the second phase range and a second edge of the input data within the third phase range, and further configured to determine, in response to the lock-enable signal, that:
the operational rate is the full rate based on the first edge and the second edge are being undetected;
the operational rate is the half rate based on the first edge being undetected and the second edge being detected; and
the operational rate is the quarter rate based on the first edge and the second edge being detected.

5. The CDR circuit of claim 4, wherein the dead zone calibration circuit further detects a third edge of the input data within the fourth phase range,
wherein, in a first case where the operational rate is determined as the full rate, the dead zone calibration circuit determines that the multi-phase clock signal is locked within the dead zone based on the first edge, the second edge, or the third edge being detected in response to the calibration-enable signal,
wherein, in a second case where the operational rate is determined as the half rate, the dead zone calibration circuit determines that the multi-phase clock signal is locked within the dead zone based on the first edge or the third edge being detected in response to the calibration-enable signal, and
wherein, in a third case where the operational rate is determined as the quarter rate, the dead zone calibration circuit determines that the multi-phase clock signal is unlocked within the dead zone in response to the calibration-enable signal.

6. The CDR circuit of claim 1, wherein the dead zone calibration circuit provides an additional charge pump current to a loop filter included in the phase-locked loop circuit to change the phase of the multi-phase clock signal based on the multi-phase clock signal being locked within the dead zone.

7. The CDR circuit of claim 1, wherein a phase range of the multi-phase clock signal corresponding to one period of the multi-phase clock signal is divided into a first phase range, a second phase range, a third phase range, and a fourth phase range, and
wherein the dead zone calibration circuit includes:
an edge detection block configured to detect a first edge of the input data within the second phase range, a second edge of the input data within the third phase range, and a third edge of the input data within the fourth phase range;
a rate determination block configured to determine the operational rate based on the lock-enable signal, the first edge, and the second edge;
a dead zone detection block configured to determine whether the multi-phase clock signal is locked within the dead zone based on the calibration-enable signal, the operational rate, the first edge, the second edge, and the third edge; and a dead zone charge pump configured to provide an additional charge pump current to a loop filter included in the phase-locked loop circuit based on the multi-phase clock signal being locked within the dead zone.

8. The CDR circuit of claim 7, wherein the multi-phase clock signal includes a first clock signal, a second clock signal, a third clock signal, a fourth clock signal, a fifth clock signal, a sixth clock signal, a seventh clock signal, and an eighth clock signal having different phases, and
wherein the edge detection block includes:
a first flip-flop configured to sample the input data in response to the third clock signal;
a second flip-flop configured to sample the input data in response to the fifth clock signal;
a third flip-flop configured to sample the input data in response to the seventh clock signal;
a fourth flip-flop configured to sample the input data in response to the first clock signal;
a first XOR gate configured to detect the first edge by performing a first XOR operation on a first output signal of the first flip-flop and a second output signal of the second flip-flop;
a second XOR gate configured to detect the second edge by performing a second XOR operation on the second output signal of the second flip-flop and a third output signal of the third flip-flop; and
a third XOR gate configured to detect the third edge by performing a third XOR operation on the third output signal of the third flip-flop and a fourth output signal of the fourth flip-flop.

9. The CDR circuit of claim 8, wherein the edge detection block further includes:
a fifth flip-flop located between the first flip-flop and the first XOR gate, and configured to sample the first output signal of the first flip-flop in response to the fourth clock signal;
a sixth flip-flop located between the second flip-flop and the first XOR gate, and configured to sample the second output signal of the second flip-flop in response to the sixth clock signal;
a seventh flip-flop located between the second flip-flop and the second XOR gate, and configured to sample the second output signal of the second flip-flop in response to the sixth clock signal;
an eighth flip-flop located between the third flip-flop and the second XOR gate, and configured to sample the third output signal of the third flip-flop in response to the sixth clock signal;
a ninth flip-flop located between the third flip-flop and the third XOR gate, and configured to sample the third output signal of the third flip-flop in response to the eighth clock signal; and
a tenth flip-flop located between the fourth flip-flop and the third XOR gate, and configured to sample the fourth output signal of the fourth flip-flop in response to the eighth clock signal.

10. The CDR circuit of claim 8, wherein the rate determination block includes:
a first multiplexer configured to selectively output a first XOR output signal of the first XOR gate or a low power supply voltage in response to the lock-enable signal as a fifth output signal;
a second multiplexer configured to selectively output a second XOR output signal of the second XOR gate or the low power supply voltage in response to the lock-enable signal as a sixth output signal;

an eleventh flip-flop configured to generate a first rate detection signal by sampling a high power supply voltage in response to the fifth output signal of the first multiplexer; and a twelfth flip-flop configured to generate a second rate detection signal by sampling the high power supply voltage in response to the sixth output signal of the second multiplexer.

11. The CDR circuit of claim 10, wherein the digital block is configured to control the multi-rate phase detector to operate:

at a full rate as the operational rate based on both of the first rate detection signal and the second rate detection signal having a low level;

at a half rate as the operational rate based on the first rate detection signal having the low level and the second rate detection signal having a high level; and at a quarter rate as the operational rate based on both of the first rate detection signal and the second rate detection signal having the high level.

12. The CDR circuit of claim 8, wherein the dead zone detection block includes:

a third multiplexer configured to selectively output a first XOR output signal of the first XOR gate or a low power supply voltage as a first calibration signal in response to the calibration-enable signal;

a fourth multiplexer configured to selectively output a second XOR output signal of the second XOR gate or the low power supply voltage as a second calibration signal in response to the calibration-enable signal;

a fifth multiplexer configured to selectively output a third XOR output signal of the third XOR gate or the low power supply voltage as a third calibration signal in response to the calibration-enable signal;

a first OR gate configured to output a full rate calibration signal by performing a first OR operation on the first calibration signal, the second calibration signal, and the third calibration signal;

a second OR gate configured to output a half rate calibration signal by performing a second OR operation on the first calibration signal and the third calibration signal; and a sixth multiplexer configured to selectively output the full rate calibration signal, the half rate calibration signal, or the low power supply voltage as a dead zone detection signal in response to an operational rate signal corresponding to the operational rate.

13. The CDR circuit of claim 12, wherein the dead zone charge pump does not provide the additional charge pump current to the loop filter based on the dead zone detection signal having a low level, and provides the additional charge pump current to the loop filter based on the dead zone detection signal having a high level.

14. The CDR circuit of claim 7, wherein the additional charge pump current is a negative current, and wherein the phase-locked loop circuit increases the phase of the multi-phase clock signal based on the additional charge pump current provided by the dead zone charge pump.

15. The CDR circuit of claim 1, wherein the phase-locked loop circuit includes:

the multi-rate phase detector configured to detect a phase difference between the input data and the multi-phase clock signal;

a charge pump configured to generate a charge pump current in response to the phase difference detected by the multi-rate phase detector;

a loop filter configured to generate a control voltage by filtering the charge pump current; and a voltage-controlled oscillator configured to generate the multi-phase clock signal based on the control voltage.

16. The CDR circuit of claim 15, wherein the multi-phase clock signal includes a first clock signal, a second clock signal, a third clock signal, a fourth clock signal, a fifth clock signal, a sixth clock signal, a seventh clock signal, and an eighth clock signal having different phases, and wherein the multi-rate phase detector includes:

a first flip-flop, a second flip-flop, a third flip-flop, a fourth flip-flop, a fifth flip-flop, a sixth flip-flop, a seventh flip-flop, and an eighth flip-flop configured to sample the input data in response to the first clock signal, the second clock signal, the third clock signal, the fourth clock signal, the fifth clock signal, the sixth clock signal, the seventh clock signal, and the eighth clock signal, respectively;

a first XOR gate including a first input terminal, a second input terminal, and a first output terminal at which an up-signal is output;

a second XOR gate including a third input terminal, a fourth input terminal, and a second output terminal at which a down-signal is output;

a first switching block configured to selectively provide a first output signal of the first flip-flop, a third output signal of the third flip-flop, a fifth output signal of the fifth flip-flop, or a seventh output signal of the seventh flip-flop to the first input terminal in response to a digital code received from the digital block;

a second switching block configured to selectively provide a second output signal of the second flip-flop, a fourth output signal of the fourth flip-flop, a sixth output signal of the sixth flip-flop, or an eighth output signal of the eighth flip-flop to the second input terminal and the third input terminal in response to the digital code; and a third switching block configured to selectively provide the third output signal of the third flip-flop, the fifth output signal of the fifth flip-flop, the seventh output signal of the seventh flip-flop, or the first output signal of the first flip-flop to the fourth input terminal in response to the digital code.

17. The CDR circuit of claim 16, wherein, in a first case where the operational rate is determined as a full rate, the multi-rate phase detector outputs the sixth output signal of the sixth flip-flop as recovered data, wherein, in a second case where the operational rate is determined as a half rate, the multi-rate phase detector outputs the fourth output signal of the fourth flip-flop and the eighth output signal of the eighth flip-flop as the recovered data, and wherein, in a third case where the operational rate is determined as a quarter rate, the multi-rate phase detector outputs the first output signal of the first flip-flop, the third output signal of the third flip-flop, the fifth output signal of the fifth flip-flop, and the seventh output signal of the seventh flip-flop as the recovered data.

18. A display device comprising:

a display panel including a plurality of pixels;

a data driver including a clock data recovery (CDR) circuit configured to generate a multi-phase clock signal and recovered data based on input data, and configured to provide data signals corresponding to the recovered data to the plurality of pixels; and a controller configured to provide the input data to the data driver, wherein the CDR circuit includes:

a phase-locked loop circuit configured to generate the multi-phase clock signal based on the input data, the phase-locked loop circuit including a multi-rate phase detector being operable at a plurality of rates, the multi-rate phase detector configured to operate at an initial rate that is a predetermined one of the plurality of rates in an initial period;

a lock detector configured to generate a lock-enable signal by detecting a lock state of the phase-locked loop circuit;

a dead zone calibration circuit configured to determine an operational rate corresponding to a data rate of the input data among the plurality of rates in response to the lock-enable signal; and a digital block configured to control the multi-rate phase detector to operate at the operational rate and generate a calibration-enable signal, and wherein the dead zone calibration circuit determines whether the multi-phase clock signal is locked within a dead zone in response to the calibration-enable signal, and changes a phase of the multi-phase clock signal based on the multi-phase clock signal being locked within the dead zone.

19. A method comprising:

generating a multi-phase clock signal based on input data by operating a multi-rate phase detector that is operable at a plurality of rates at an initial rate that is a predetermined one of the plurality of rates in an initial period;

detecting a lock state of a phase-locked loop circuit including the multi-rate phase detector;

determining an operational rate corresponding to a data rate of the input data among the plurality of rates;

controlling the multi-rate phase detector to operate at the operational rate;

determining whether the multi-phase clock signal is locked within a dead zone; and changing a phase of the multi-phase clock signal based on the multi-phase clock signal being locked within the dead zone.

20. The method of claim 19, wherein the plurality of rates includes a full rate, a half rate, and a quarter rate, and wherein the initial rate is the full rate.

* * * * *